(12) United States Patent
Oshima et al.

(10) Patent No.: US 9,698,337 B2
(45) Date of Patent: Jul. 4, 2017

(54) PIEZOELECTRIC CERAMIC, PIEZOELECTRIC ELEMENT, AND ELECTRONIC APPLIANCE

(71) Applicant: CANON KABUSHIKI KAISHA, Tokyo (JP)

(72) Inventors: Kanako Oshima, Tokyo (JP); Masatoshi Watanabe, Isehara (JP); Tatsuya Suzuki, Kawasaki (JP); Mikio Shimada, Tokyo (JP); Shinya Koyama, Tokyo (JP); Yasushi Shimizu, Fujisawa (JP); Tatsuo Furuta, Machida (JP); Hidenori Tanaka, Yokohama (JP); Makoto Kubota, Yokohama (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/989,693

(22) Filed: Jan. 6, 2016

(65) Prior Publication Data

US 2016/0204335 A1 Jul. 14, 2016

(30) Foreign Application Priority Data

Jan. 9, 2015 (JP) .................................. 2015-003579

(51) Int. Cl.
*H01L 41/187* (2006.01)
*C04B 35/462* (2006.01)
(Continued)

(52) U.S. Cl.
CPC ............ *H01L 41/1871* (2013.01); *B06B 1/06* (2013.01); *B06B 1/0611* (2013.01);
(Continued)

(58) Field of Classification Search
CPC ... H01L 41/43; H01L 41/042; H01L 41/0471; H01L 41/08; H01L 41/09; H01L 41/1871;
(Continued)

(56) References Cited

U.S. PATENT DOCUMENTS 9,006,959 B2 * 4/2015 Yamazaki ............. C04B 35/462
252/62.9 R
2013/0241347 A1 * 9/2013 Suzuki ..................... B41J 2/161
310/311

(Continued)

FOREIGN PATENT DOCUMENTS

JP 5217997 B2 6/2013
JP 5344456 B2 11/2013

*Primary Examiner* — Thomas Dougherty
(74) *Attorney, Agent, or Firm* — Canon U.S.A., Inc., IP Division

(57) ABSTRACT

A piezoelectric ceramic includes: a metal oxide represented by General Formula (1); and 0.04 parts by weight or more and 0.36 parts by weight or less of Mn and 0.042 parts by weight or more and 0.850 parts by weight or less of Bi on a metal basis relative to 100 parts by weight of the metal oxide, wherein the piezoelectric ceramic includes a plurality of first crystal grains having a perovskite structure, and a plurality of second crystal grains provided at a grain boundary between the first crystal grains and having a crystal structure different from that of the first crystal grain, and the second crystal grain mainly contains at least one metal oxide selected from $Ba_4Ti_{12}O_{27}$ and $Ba_6Ti_{17}O_{40}$.

$$(Ba_{1-x}Ca_x)_a(Ti_{1-y}Zr_y)O_3 \quad (1)$$

(where $0.09 \leq x \leq 0.30$, $0.025 \leq y \leq 0.085$, $0.986 \leq a \leq 1.02$)

32 Claims, 16 Drawing Sheets

(51) Int. Cl.
- H01L 41/047 (2006.01)
- H02N 2/00 (2006.01)
- H01L 41/09 (2006.01)
- H01L 41/08 (2006.01)
- H01L 41/083 (2006.01)
- B06B 1/06 (2006.01)
- H01L 41/04 (2006.01)
- G02B 27/00 (2006.01)
- H04N 5/217 (2011.01)
- B41J 2/14 (2006.01)

(52) U.S. Cl.
CPC ....... *B41J 2/14233* (2013.01); *B41J 2/14274* (2013.01); *G02B 27/0006* (2013.01); *H01L 41/042* (2013.01); *H01L 41/0471* (2013.01); *H01L 41/0477* (2013.01); *H01L 41/08* (2013.01); *H01L 41/083* (2013.01); *H01L 41/09* (2013.01); *H02N 2/001* (2013.01); *H04N 5/2171* (2013.01); *B41J 2202/03* (2013.01)

(58) Field of Classification Search
CPC ....... C04B 35/462; C04B 35/495; B06B 1/06; B06B 1/0611; B41J 2/14233; B41J 2/14274; H02N 2/001; H04N 5/2171
USPC ....... 310/358; 501/134; 252/62.9 PZ, 62.9 R
See application file for complete search history.

(56) References Cited

U.S. PATENT DOCUMENTS

| | | | |
|---|---|---|---|
| 2014/0197156 A1* | 7/2014 | Ino | H01C 7/02 219/538 |
| 2016/0204336 A1* | 7/2016 | Shimizu | B41J 2/14233 347/68 |

* cited by examiner

PIEZOELECTRIC CERAMIC, PIEZOELECTRIC ELEMENT, AND ELECTRONIC APPLIANCE

BACKGROUND OF THE INVENTION

Field of the Invention

The present invention relates to a piezoelectric ceramic with both the excellent piezoelectric constant and the excellent mechanical quality factor particularly at low temperature. The present invention moreover relates to a piezoelectric element, a multilayered piezoelectric element, a liquid discharge head, a liquid discharge device, an ultrasonic motor, an optical appliance, a vibration device, a dust removing device, an imaging device, an electronic appliance, or a piezoelectric device including the piezoelectric ceramic, and a manufacturing method for the piezoelectric ceramic.

Description of the Related Art

General piezoelectric ceramics are the $ABO_3$ perovskite oxides such as lead zirconate titanate (hereinafter referred to as PZT). Since PZT contains lead as the A-site element, the influence on the environment has been concerned. In view of this, the piezoelectric ceramic including a perovskite oxide not containing lead has been suggested.

A known example of the perovskite type piezoelectric ceramic not containing lead is barium titanate. Japanese Patent No. 5344456 has disclosed the piezoelectric ceramic in which a part of the barium site of barium titanate is replaced by calcium and a part of the titanium site thereof is replaced by zirconium in order to improve the piezoelectric characteristics of barium titanate at around the room temperature. This piezoelectric ceramic, however, has the low mechanical quality factor and the low durability at high temperature, and is therefore unsuitable for the use in a resonant device.

Japanese Patent No. 5217997 has disclosed the piezoelectric ceramic in which a part of the barium site in barium titanate is replaced by calcium and manganese, iron, or copper is added. According to Japanese Patent No. 5217997, this ceramic has the excellent mechanical quality factor at around room temperature. At low temperature (0° C. or less), however, the mechanical quality factor is low and is therefore unsuitable for the use in a resonant device.

The present invention has been made in view of the above circumstances, and is to provide a piezoelectric ceramic having the excellent piezoelectric constant and mechanical quality factor particularly at low temperature by controlling the composition of the crystal grain boundary and the crystal structure.

The present invention moreover provides a piezoelectric element, a multilayered piezoelectric element, a liquid discharge head, a liquid discharge device, an ultrasonic motor, an optical appliance, a vibration device, a dust removing device, an imaging device, an electronic appliance, or a piezoelectric device including the piezoelectric ceramic, and a manufacturing method for the piezoelectric ceramic.

SUMMARY OF THE INVENTION

A piezoelectric ceramic for solving the above problem is a piezoelectric ceramic containing a metal oxide represented by General Formula (1) below and 0.04 parts by weight or more and 0.36 parts by weight or less of Mn and 0.042 parts by weight or more and 0.850 parts by weight or less of Bi on a metal basis relative to 100 parts by weight of the metal oxide, wherein: the piezoelectric ceramic includes a plurality of first crystal grains having a perovskite structure, and a plurality of second crystal grains provided at a grain boundary between the first crystal grains and having a crystal structure different from that of the first crystal grain; and the second crystal grain mainly contains at least one metal oxide selected from $Ba_4Ti_{12}O_{27}$ and $Ba_6Ti_{17}O_{40}$.

$$(Ba_{1-x}Ca_x)_a(Ti_{1-y}Zr_y)O_3 \quad (1)$$

(where $0.09 \leq x \leq 0.30$, $0.025 \leq y \leq 0.085$, $0.986 \leq a \leq 1.02$)

A piezoelectric element for solving the problem includes at least a first electrode, a piezoelectric ceramic portion, and a second electrode, wherein the piezoelectric ceramic constituting the piezoelectric ceramic portion is the aforementioned piezoelectric ceramic.

A multilayered piezoelectric element for solving the problem is a multilayered piezoelectric element formed by alternately stacking a plurality of piezoelectric ceramic layers and a plurality of electrode layers including an internal electrode, wherein the piezoelectric ceramic layers are composed of the aforementioned piezoelectric ceramic.

A liquid discharge head for solving the problem includes at least a liquid chamber including a vibration portion provided with the piezoelectric element or the multilayered piezoelectric element, and a discharge port communicating with the liquid chamber.

A liquid discharge device for solving the problem includes a placement portion for a transfer target body and the aforementioned liquid discharge head.

An ultrasonic motor for solving the problem includes a vibration body provided with the piezoelectric element or the multilayered piezoelectric element and a mobile body in contact with the vibration body.

An optical appliance for solving the problem includes the ultrasonic motor in a driving portion.

A vibration device for solving the problem includes a vibration body provided with the piezoelectric element or the multilayered piezoelectric element on a vibration plate.

A dust removing device for solving the problem includes the vibration device in a vibration portion.

An imaging device for solving the problem includes at least the dust removing device and an imaging element unit, wherein the vibration plate of the dust removing device is provided on a light receiving surface side of the imaging element unit.

An electronic appliance for solving the problem includes a piezoelectric acoustic component including the piezoelectric element or the multilayered piezoelectric element.

A piezoelectric device for solving the problem includes the piezoelectric element or the multilayered piezoelectric element, and at least one of a voltage application unit configured to apply voltage to the piezoelectric element or the multilayered piezoelectric element and a power extraction unit configured to extract power from the piezoelectric element or the multilayered piezoelectric element.

A manufacturing method for a piezoelectric ceramic for solving the problem includes: a step of providing mixed powder by mixing a first powder body and a second powder body so that a mixing ratio of the first powder body becomes 95 mass % or more and 99.9 mass % or less, the first powder body including a metal oxide which includes Ba, Ca, Ti, and Zr and which has a perovskite structure and the second powder body including a metal oxide which includes Ba and Ti, with a molar number of Ti excessive compared to a molar number of Ba, and which has a crystal structure different from the first powder body; a granulating step; a molding step; and a sintering step of sintering at a maximum temperature of 1380° C. or less, sequentially.

Further features of the present invention will become apparent from the following description of exemplary embodiments (with reference to the attached drawings).

DESCRIPTION OF THE EMBODIMENTS

Figure 1:
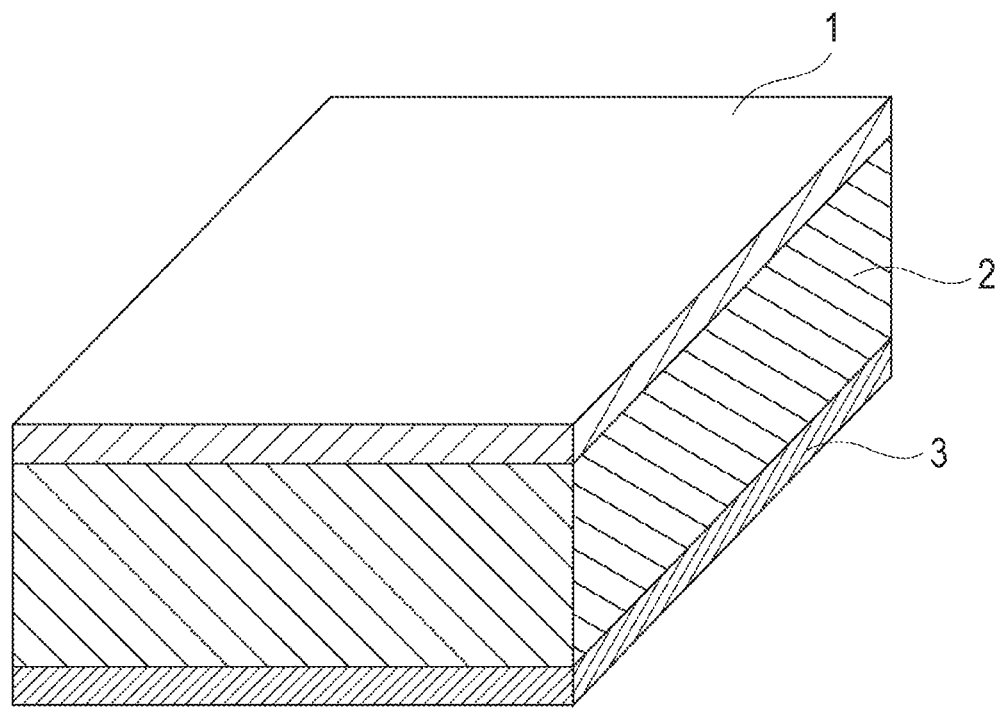
FIG. 1 is a schematic view illustrating one embodiment of a structure of a piezoelectric element according to the present invention.

An embodiment for carrying out the present invention will be described below.

A piezoelectric ceramic according to the present invention is as below.

A piezoelectric ceramic includes: a metal oxide represented by General Formula (1); and 0.04 parts by weight or more and 0.36 parts by weight or less of Mn and 0.042 parts by weight or more and 0.850 parts by weight or less of Bi on a metal basis relative to 100 parts by weight of the metal oxide, wherein the piezoelectric ceramic includes a plurality of first crystal grains having a perovskite structure, and a plurality of second crystal grains provided at a grain boundary between the first crystal grains and having a crystal structure different from that of the first crystal grain, and the second crystal grain mainly contains at least one metal oxide selected from $Ba_4Ti_{12}O_{27}$ and $Ba_6ZTi_{17}O_{40}$.

$$(Ba_{1-x}Ca_x)_a(Ti_{1-y}Zr_y)O_3 \qquad (1)$$

(where $0.09 \le x \le 0.30$, $0.025 \le y \le 0.085$, $0.986 \le a \le 1.02$)

By satisfying the above condition, the piezoelectric ceramic according to the present invention can have both the excellent piezoelectric constant and the excellent mechanical quality factor particularly at low temperature.

In the present specification, the term "ceramic" refers to an aggregate (also referred to as "bulk") of crystal grains sintered to be hardened through a thermal process and having a metal oxide as a basic component, which is so-called polycrystal. The ceramic includes the aggregate that has been processed after being sintered. However, powder or slurry having the powder dispersed therein is not included in this term.

General Formula (1) expresses the average composition focusing the metal oxide other than Mn and Bi in the piezoelectric ceramic according to the present invention. In the microscopic point of view, the piezoelectric ceramic according to the present invention is a group of first crystal grains with the perovskite structure and second crystal grains with the non-perovskite structure, so that the metal composition ratio is different depending on the area.

In General Formula (1), "x" representing the molar ratio of Ca in the A-site is in the range of $0.09 \le x \le 0.30$. One characteristic of the piezoelectric ceramic according to the present invention is that the piezoelectric performance (mechanical quality factor or piezoelectric constant) is changed depending on the ambient temperature. If "x" is less than 0.09, the change in piezoelectric characteristic depending on the ambient temperature becomes too large, which makes it difficult to control the driving frequency or the driving voltage. If, on the other hand, "x" is more than 0.300, the piezoelectric constant becomes too low; in this case, if such a piezoelectric ceramic is used in the piezoelectric device, the driving voltage becomes too high. Specifically, $0.10 \le x \le 0.20$ is preferable and $0.12 \le x \le 0.18$ is more preferable.

In General. Formula (1), "y" representing the molar ratio of Zr in the B-site is in the range of $0.025 \leq y \leq 0.085$. If "y" is more than 0.085, the Curie temperature is decreased, in which case the change over time is large and the piezoelectric characteristic is decreased accordingly. If "y" is less than 0.025, the piezoelectric constant becomes too small at the room temperature or low temperature below the room temperature. Specifically, $0.040 \leq y \leq 0.083$ is preferable and $0.050 \leq y \leq 0.080$ is more preferable.

In General Formula (1), "a" representing the ratio between the molar amount of Ba and Ca and the molar amount of Ti and Zr is in the range of $0.986 \leq a \leq 1.020$. If "a" is less than 0.986, the piezoelectric ceramic contain more first crystal grains that have grown abnormally, thereby having lower strength. If "a" is more than 1.020, the sintering temperature becomes insufficient for grain growth so that the piezoelectric ceramic with the sufficient density cannot be obtained. Specifically, $0.990 \leq a \leq 1.015$ is preferable and $0.993 \leq a \leq 1.010$ is more preferable.

In the piezoelectric ceramic according to the present invention, how to specify the numerals of "x", "y", and "z" is not limited. Since these values indicate the average composition of the entire ceramic, a method of analyzing the compositions by dissolving the whole, such as ICP optical emission spectrometry may be used.

The piezoelectric ceramic according to the present invention includes the metal oxide represented by General Formula (1) and Mn by 0.04 parts by weight or more and 0.36 parts by weight or less on a metal basis relative to 100 parts by weight of the metal oxide.

The piezoelectric ceramic according to the present invention includes Mn in the above range, so that the mechanical quality factor (Qm) at the room temperature and in the low-temperature region below the room temperature is improved by the combination with the effect obtained by including the second crystal grain. The mechanical quality factor refers to the factor representing the elastic loss due to the vibration when the piezoelectric ceramic is evaluated as a vibrator. The magnitude of the mechanical quality factor is observed as the sharpness of the resonance curved in the impedance measurement. When the mechanical quality factor is improved, the long-term reliability of the piezoelectric element in the case of applying the voltage and driving the piezoelectric ceramic as the piezoelectric element is ensured.

When Mn is contained by less than 0.04 parts by weight, the piezoelectric constant (for example, $d_{31}$) or the mechanical quality factor is decreased drastically over time, so that the long-term use is impossible. On the other hand, when Mn is contained by more than 0.36 parts by weight, the dissipation factor is increased, so that the driving of the piezoelectric ceramic consumes more power, which is not preferable.

Mn is not limited to the metal Mn and may be in any state as long as Mn component is contained in the piezoelectric ceramic. Mn can have other valence such as 4+, 2+, or 3+; when the valence of Mn is less than 4+, Mn serves as an acceptor. Mn serving as the acceptor in the perovskite structure crystal forms an oxygen vacancy in the crystal. When the oxygen vacancy forms a defect dipole, the mechanical quality factor of the piezoelectric ceramic can be improved. In order for Mn to have the valence of less than 4+, it is preferable that the trivalent element is present in the A-site. The preferable trivalent element is Bi. The valent of Mn can be evaluated by the measurement of the temperature dependency of the magnetic susceptibility.

The piezoelectric ceramic according to the present invention includes the metal oxide represented by General Formula (1) and 0.042 parts by weight or more and 0.850 parts by weight or less of Bi on a metal basis relative to 100 parts by weight of the metal oxide.

When Bi is contained by less than 0.042 parts by weight, the mechanical quality factor is decreased. On the other hand, when Bi is contained by more than 0.850 parts by weight, the piezoelectric constant is decreased. Bi is more preferably contained by 0.1 parts by weight or more and 0.4 parts by weight or less. Bi is not limited to the metal. Bi and may be in any state as long as the Bi component is contained in the piezoelectric ceramic. Bi is preferably in the state of the solid solution in the A-site as the trivalent Bi. The valent of Bi can be identified by, for example, X-ray absorption fine structure (XAFS) measurement.

For identifying the content of Mn or Bi based on the metal oxide represented by General Formula (1), first, the content of each metal is calculated in the measurement of the piezoelectric ceramic by X-ray fluorescence spectroscopy (XRF), ICP optical emission spectrometry, atomic absorption analysis, EPMA (Electron Probe Micro Analyzer), SEM-WDX (Scanning Electron Microscope-Wavelength Dispersive Spectrometer), SEM-EDX (Scanning Electron Microscope-Energy Dispersive X-ray Spectrometer), STEM-EDX (Scanning Transmission Electron Microscope-Energy Dispersive X-ray Spectrometer), or the like. Based on the content of each metal, the elements included in the metal oxide represented by General Formula (I) are converted in terms of oxides, and assuming the total weight as 100, the weight of Mn or Bi is represented relative to that total weight. The appropriate analyzing method for knowing the content of Mn or Bi included in the ceramic is ICP optical emission spectrometry. For the purpose of knowing the position or content of Mn or Bi in the ceramic, EPMA, SEM-WDX, SEM-EDX, and STEM-EDX are appropriate.

The piezoelectric ceramic according to the present invention includes a plurality of first crystal grains having a perovskite structure, and a plurality of second crystal grains provided at a grain boundary between the first crystal grains and having a crystal structure different from that of the first crystal grain.

In the present invention, the crystal grain with the perovskite structure refers to the grain including the metal oxide with the perovskite structure, which is ideally the cubic structure as described in Iwanami dictionary of physic and chemistry, fifth edition (published on Feb. 20, 1998), and does not include the layered perovskite structure. The metal oxide with the perovskite structure is generally expressed by a chemical formula of $ABO_3$. In the perovskite metal oxide, the elements A and B occupy the particular positions in the unit lattice called the A-site and B-site in the form of ions. For example, in the case of the cubic unit lattice, the element A is in the apex of a cube and the element B is in the body center. The element O is in the face center of the cube as the negative ion of oxygen. If the element A, the element B, and the element O are slightly shifted in coordinate from the symmetric position of the unit lattice, the unit lattice of the perovskite structure is distorted and the crystal system such as a tetragonal system, a rhombohedral system, or an orthorhombic system is formed. The first crystal grain according to the present invention is included in a part of the metal oxide represented by General Formula (1) and therefore the element A includes Ba and Ca, the element B includes Ti and Zr. If the element A, the element B, and the element O are shifted in coordinate from the symmetric position of the unit lattice, the unit lattice of the perovskite structure is distorted and the crystal system such as a tetragonal system, a rhombohedral system, or an orthorhombic system is formed. From the viewpoint of achieving the piezoelectric ceramic with the excellent electromechanical coupling coefficient, the crystal system of the perovskite metal oxide is preferably a tetragonal structure at room temperature.

In the present specification, "crystal grain" refers to the grain included in the polycrystal as descried in the article of "polycrystal" according to Iwanami dictionary of physic and chemistry, fifth edition (published on Feb. 20, 1998), and does not include the particle with fluidity.

In the present specification, "grain boundary" refers to the interface between the crystal grains (this interface includes the interface in the case of the linear contact and the point contact). If the first crystal grains are directly in contact with each other, the contact surface therebetween is the grain boundary; if the first crystal grains are in contact through a second crystal grain smaller than the first crystal grain, the space where the first crystal grains are close to each other is called the grain boundary. In this specification, such a space that is formed of three crystal grains may be referred to as "triple junction" in the grain boundary.

The main component of the second crystal grain included in the piezoelectric ceramic according to the present invention is at least one metal oxide selected from $Ba_4Ti_{12}O_{27}$ and $Ba_6Ti_{17}O_{40}$. In the present specification, "main component" indicates the component that constitutes 50 wt % or more or 50 vol % or more of the target material. The state in which the main component of the second crystal grain is $Ba_4Ti_{12}O_{27}$ and $Ba_6Ti_{17}O_{40}$ refers to the state in which the second crystal grain contains $Ba_4Ti_{12}O_{27}$ and $Ba_6Ti_{17}O_{40}$ and the total of $Ba_4Ti_{12}O_{27}$ and $Ba_4Ti_{12}O_{27}$ constitutes 50 wt % or more or 50 vol % or more of the second crystal grains. $Ba_4Ti_{12}O_{27}$ and $Ba_6Ti_{17}O_{40}$ are similar to the metal included in the metal oxide represented by General Formula (1) and therefore can provide the effect of the present invention without deteriorating the piezoelectric characteristic of the first crystal grain even if a different element is mixed.

In general, adding Mn to the piezoelectric ceramic does not necessarily make all the added Mn exist in the crystal grain (in this specification, in the first crystal grain), and in some cases, the Mn component such as manganese oxide ($MnO_x$) exists in the segregated state in the grain boundary.

The segregation of the Mn component reduces the Mn concentration in the crystal grains and decreases the mechanical quality factor of the piezoelectric ceramic. Moreover, the gap induces the segregation of the Mn component. The segregated Mn component, if connected, would serve as a conductive path, in which case the insulating property of the piezoelectric ceramic is deteriorated.

In the piezoelectric ceramic according to the present invention, if the second crystal grain exists at the grain boundary between the first crystal grains, the gap between the first crystal grains is filled with the second crystal grain, whereby the conductive path for the leakage current is blocked. This allows the piezoelectric ceramic to have a higher electric insulating property. The second crystal grain is a dielectric; therefore, as compared to the case in which the gap between the first crystal grains remains unfilled, the dielectric property (specific dielectric constant) of the piezoelectric ceramic is increased and the piezoelectric constant is also increased. In addition, the second crystal grain suppresses the deposition into the grain boundary of Mn included in the piezoelectric ceramic according to the present invention and therefore the Mn concentration in the state of the solid solution in the first crystal grains is increased. As a result, the mechanical quality factor of the piezoelectric ceramic becomes high at room temperature or in a low-temperature region below the room temperature.

Figure 15:
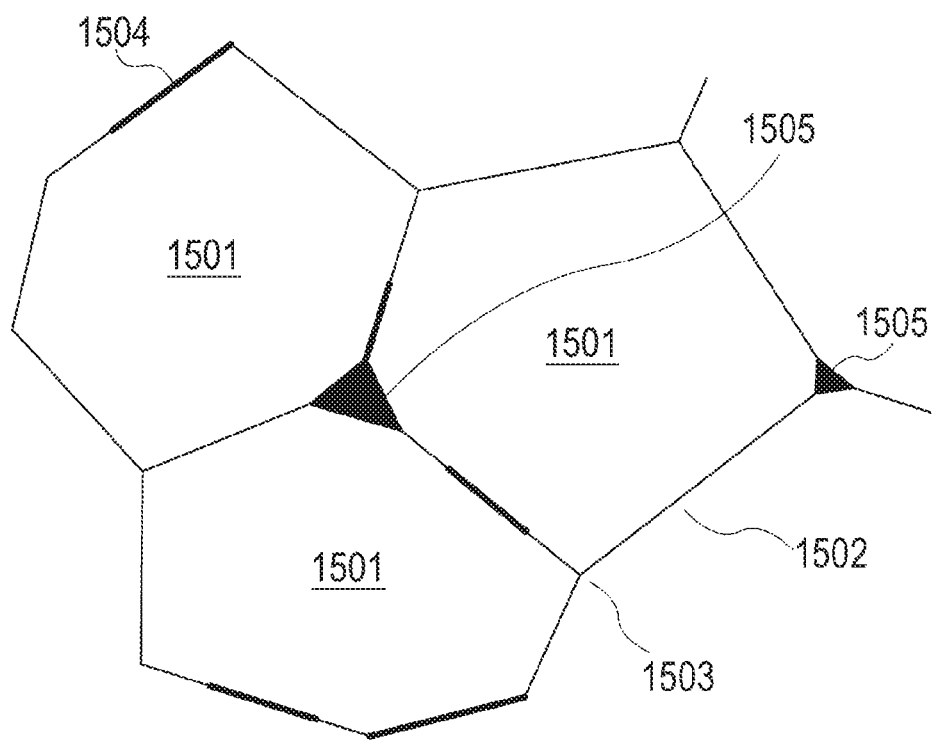
FIG. 15 is a schematic diagram illustrating an example of the relation among first crystal grains and second crystal grains and the grain boundary included in the piezoelectric ceramic according to the present invention.

The effect of the present invention is remarkable at 0° C. or less where the mechanical quality factor is particularly low. FIG. 15 is a conceptual diagram illustrating the piezoelectric ceramic according to the present invention, and schematically expressing the relation among the first crystal grains, the second crystal grains, and the grain boundary.

The first crystal grain is denoted by 1501, and the first crystal grains are in contact with each other through at least one of the grain boundary and the triple junction. The grain boundary between the first crystal grains is denoted by 1502, and the triple junction is denoted by 1503. The second crystal grain mainly containing at least one metal oxide selected from $Ba_4Ti_{12}O_{27}$ and $Ba_6Ti_{17}O_{40}$ exists in a part of the grain boundary 1502 of the first crystal grain or the triple junction 1503 in the piezoelectric ceramic according to the present invention. The second crystal grain existing at the boundary between the first crystal grains is denoted by 1504. The second crystal grain existing at the triple junction is denoted by 1505.

The main component of the second crystal grain is more preferably $Ba_4Ti_{12}O_{27}$. $Ba_4Ti_{12}O_{27}$ can stably contain more Mn than $Ba_6Ti_{17}O_{40}$. Thus, the piezoelectric ceramic according to the present invention can maintain the high insulating property and the piezoelectric characteristic because the change over time is suppressed.

In the piezoelectric ceramic according to the present invention, the ratio A1/B1 of the molar number A1 of Ba and Ca to the molar number B1 of Ti and Zr in the first crystal grain in contact with the second crystal grain, and the ratio A2/B2 of the molar number A2 of Ba and Ca to the molar number B2 of Ti and Zr in the first crystal grain not in contact with the second crystal grain preferably satisfy the relation of A1/B1>A2/B2. By satisfying this relation, the defect in the interface between the first crystal grain and the second crystal grain is reduced and the insulating property of the piezoelectric ceramic is improved.

For evaluating the ratios A1/B1 and A2/B2, EPMA, SEM-WDX, SEM-EDX, STEM-EDX, or the like that can locate the second crystal grain and locally analyze the composition is suitable.

The proportion of the second crystal grains included in the grain boundary relative to the piezoelectric ceramic can be calculated by, for example, a method of using a scanning electron microscope or an optical microscope. For example, in the case of using a scanning electron microscope, the surface or cross section of the piezoelectric ceramic is observed using a reflection electron image of the scanning electron microscope. In this observation method, the second crystal grains and the first crystal grains are observed with the different contrast, so that the area ratio of both grains can be obtained, respectively. The proportion of the second crystal grains in the measurement of the surface or cross section of the piezoelectric ceramic according to the present invention is preferably 0.05 area % or more and 1 area % or less of the entire area of the surface or cross section of the piezoelectric ceramic.

If the proportion of the second crystal grains included in the grain boundary is less than 0.05 area % of the entire piezoelectric ceramic, the effect of the present invention, which is the higher mechanical quality factor, higher piezoelectric constant, and higher insulating property, may not be obtained sufficiently. If the proportion of the second crystal grains included in the grain boundary is more than 1 area % of the entire piezoelectric ceramic, the second crystal grains without the piezoelectricity are segregated excessively in the grain boundary, in which case the high piezoelectric characteristic of the first crystal grains may not be obtained sufficiently.

In the piezoelectric ceramic according to the present invention, the main component of the second crystal grain preferably contains Mn. When Mn that used to exist in the grain boundary in the form of manganese oxide or the like is contained in the main component of the second crystal grain, the amount of manganese oxide in the grain boundary can be reduced. This can suppress the deterioration in insulating property and mechanical quality factor. Mn may be contained in one of $Ba_4Ti_{12}O_{27}$ and $Ba_6Ti_{17}O_{40}$ or in both $Ba_4Ti_{12}O_{27}$ and $Ba_6Ti_{12}O_{40}$, which are the main components of the second crystal grain.

Methods for easily distinguishing the first crystal grains and the second crystal grains include a method of using a scanning electron microscope (SEM) and an observation method of using a transmission electron microscope (TEM). These methods are featured in that the first crystal grains and the second crystal grains are observed with the different contrast in the observation of the surface or the cross section of the piezoelectric ceramic.

The compounds included in the first crystal grain and the second crystal grain can be identified by, for example, comparing a diffraction image acquired from the compounds using a selected area diffraction method by the transmission electron microscope (TEM) and the data in the public references.

The selected, area diffraction method refers to a method of observing the diffraction pattern of only a particular region of the magnified image obtained by the transmission electron microscope (TEM). With this method, just the diffraction pattern from the compound can be observed.

The compositions of the crystal grains can be analyzed by STEM-EDX. STEM-EDX is a method of measuring the intensity of fluorescence X-ray at any position of a sample image observed by the scanning transmission electron microscope (STEM) according to the energy dispersive X-ray spectroscopy (EDX).

In the piezoelectric ceramic, the number of crystal grains with an equivalent circular diameter of 25 µm or less preferably constitutes 99 number % or more of the crystal grains included in the piezoelectric ceramic. By setting the number % of the crystal, grains with an equivalent circular diameter of 25 µm or less in this range, the piezoelectric ceramic according to the present invention can have the excellent mechanical strength. The mechanical strength has a negative correlation with the proportion of the crystal grains with large equivalent circular diameter. If the number % of crystal grains is less than 99 number %, more grains with an equivalent circular diameter of more than 25 µm are included, in which case the mechanical strength is possibly deteriorated.

In the piezoelectric ceramic according to the present invention, the average equivalent circular diameter of the first crystal grain included in the piezoelectric ceramic is preferably 500 nm or more and 10 µm or less.

The average equivalent circular diameter refers to the average value of the equivalent circular diameters of a plurality of first crystal grains. By setting the average equivalent circular diameter of the first crystal grains in this range, the piezoelectric ceramic according to the present invention can have the excellent piezoelectric constant and mechanical strength. If the average equivalent circular diameter is less than 500 nm, the piezoelectric constant is possibly not enough. On the other hand, if the average equivalent circular diameter is more than 10 µm, the mechanical strength is possibly not enough. The preferable range is 500 nm or more and 4.5 µm or less.

In the present invention, "equivaient circular diameter" refers to "equivalent circular diameter of projected area" generally used in the microscope observation methods, and represents the diameter of a perfect circle with the same area as the projected area of the crystal grain. In the present invention, a method of measuring the equivalent circular diameter is not limited in particular. For example, the equivalent circular diameter can be obtained by processing a photograph image obtained by photographing a surface of the piezoelectric ceramic with the polarization microscope or the scanning electron microscope. Since the optimum magnification differs depending on the grain diameter of the target, the optical microscope and the electron microscope may be used in accordance with the target. The equivalent circular diameter may be obtained from, instead of the surface of the ceramic, the image of the polished surface or the cross section.

The average equivalent circular diameter of the second crystal grains is preferably smaller than that of the first crystal grains. In other words, when the second crystal grain is relatively smaller and the grain diameter ratio represented by (the average equivalent circular diameter of the first crystal grains)/(the average equivalent circular diameter of the second crystal grains) is 1 or more, the crystal grains stick together more closely and therefore the piezoelectric ceramic has the higher insulating property.

The grain diameter ratio is preferably 2 or more, more preferably 5 or more.

The piezoelectric ceramic according to the present invention preferably has a relative density (bulk density of sintered body/theoretical density×100) of 93% or more and 100% or less. The relative density refers to the ratio of the actually measured density (bulk density of sintered body) to the theoretical density. The theoretical density is calculated from the lattice constant of the piezoelectric ceramic and the atomic weight of the elements of the piezoelectric ceramic. The lattice constant can be calculated by, for example, the X-ray diffraction measurement. The density can be measured by the Archimedes' method, for example.

If the relative density is less than 93%, the piezoelectric constant or the mechanical quality factor is possibly not enough or the mechanical strength may deteriorate.

The piezoelectric ceramic according to the present invention preferably has a relative density of 95% or more and 100% or less, and more preferably 97% or more and 100% or less.

(Manufacturing Method for Piezoelectric Ceramic)

The manufacturing method for the piezoelectric ceramic according to the present invention is not particularly limited and a typical manufacturing method for the same is hereinafter described.

(Raw Material Powder of Piezoelectric Ceramic)

In the case of fabricating the piezoelectric ceramic, a molded body is formed from solid powder of the oxide, the carbonate, the nitrate, the oxalate or the acetate including the component element, and the molded body is sintered under ambient pressure, which is a normal method. The raw materials include a metal compound such as a Ba compound, a Ca compound, a Ti compound, a. Zr compound, a Mn compound, or a Bi compound.

Examples of the Ba compound that can be used include barium oxide, barium carbonate, barium oxalate, barium acetate, barium nitrate, barium titanate, and barium zirconate. These Ba compounds are preferably the compounds with high purity (for example, purity 99.99% or more), which are commercially available.

Examples of the Ca compound that can be used include calcium oxide, calcium carbonate, and calcium titanate. These Ca compounds are preferably the compounds with high purity (for example, purity 99.99% or more), which are commercially available.

Examples of the Ti compound that can be used include titanium oxide, barium titanate, and barium titanate zirconate. These Ti compounds containing alkaline earth metal such as barium are preferably the compounds with high purity (for example, purity 99.99% or more), which are commercially available.

Examples of the Zr compound that can be used include zirconium oxide, barium zirconate, and barium titanate zirconate. These Zr compounds containing alkaline earth metal such as barium are preferably the compounds with high purity (for example, purity 99.99% or more), which are commercially available.

Examples of the Mn compound that can be used include manganese carbonate, manganese oxide, manganese dioxide, manganese acetate, and trimanganese tetraoxide.

Examples of the Bi compound that can be used include bismuth oxide.

There is no particular limitation on the raw material for adjusting "a" representing the ratio between the amount of Ba and Ca in the A-site and the molar amount of Ti and Zr in the B-site in the piezoelectric ceramic according to the present invention. The effect is the same in any of the Ba compound, the Ca compound, the Ti compound, or the Zr compound.

(Calcining of Raw Material Powder)

The raw material powder of the piezoelectric ceramic according to the present invention may be used for the molded body after being calcined as necessary. The calcining process is preferably carried out at the temperature ranging from 600° C. to 1050° C. The powder obtained by the calcining process is referred to as calcined powder.

By the calcining, the solid solution of the different kinds of metal elements can be promoted while suppressing the crystal growth. By utilizing this calcining process, the first crystal grain and the second crystal grain can be separately made. For example, for producing the calcined powder (first powder) as the precursor of the first crystal grain with the perovskite structure, the raw materials are mixed so that the molar amount of the A-site element and the B-site element is equal or is different by 2 molar % or less and then is subjected to the calcining process. The A-site element includes Ba and Ca, and the B-site element includes Ti and Zr. The other elements, for example Mn, may be included in the first powder. In addition, for producing the calcined powder (second powder) as the precursor of the second crystal, grain with the crystal structure different from the first powder (i.e., with the non-perovskite structure), the raw materials are mixed so that the intended metal composition ratio of the second crystal grain is achieved and then is subjected to the calcining process. In regard to the metal, composition ratio, Ti is preferably more than Ba in molar ratio. The calcined powder (first powder body and second powder body) is mixed at the appropriate ratio and granulated, molded, and sintered, whereby the ceramic having the second crystal grain at the grain boundary between the first crystal grains can be fabricated. In regard to the mixing ratio between the first powder and the second powder, the first powder is preferably included by 95 mass % or more and 99.9 mass % or less.

(Granulated Powder and Molded Body)

The molded body is a solid formed by molding the solid powder. Molding methods include uniaxiai pressurizing, cold hydrostatic pressurizing, warm hydrostatic pressurizing, casting, and extrusion molding. In the fabrication of the molded body, the granulated powder is preferably used. Sintering the molded body including the granulated powder has an advantage that the crystal grains of the sintered body easily have the uniform size distribution.

There is no particular limitation on the method of granulating the raw material powder of the piezoelectric ceramic. In the perspective of homogenizing the particle diameters of the granulated powder, the spray drying method is the most preferable granulating method.

Examples of the binder that can be used in the granulating include polyvinyl alcohol (PVA), polyvinyl butyral (PVB), and acrylic resin. The amount of binder to be added is preferably 1 to 10 parts by weight relative to 100 parts by weight of the raw material powder of the piezoelectric ceramic, and more preferably 2 to 5 parts by weight from the viewpoint of higher density of the molded body.
(Sintering)

A method of sintering the molded body is not particularly limited. Examples of the sintering method include an electric furnace, a gas furnace, an electrical heating method, a microwave sintering method, a millimeter wave sintering method, and HIP (heat isostatic pressing). The sintering using the electric furnace or gas may be either continuous sintering or batch-type sintering.

The sintering temperature in the sintering method is not particularly limited but is preferably the temperature at which the compounds react with each other and the crystal growth occurs sufficiently. The preferable sintering temperature is 1100° C. or more and 1380° C. or less, more preferably 1100° C. or more and 1340° C. or less from the perspective of setting the grain diameter in the range of 500 nm to 10 μm. The piezoelectric ceramic sintered in the temperature range exhibits the excellent piezoelectric constant. For stabilizing the characteristic of the piezoelectric ceramic obtained by the sintering process with high repeatability, the sintering process is preferably performed for 2 hours or more and 48 hours or less with the sintering temperature maintained constant in the above range. The sintering may be performed in two steps but the drastic temperature change is preferably avoided in consideration of the productivity.

After the piezoelectric ceramic obtained by the sintering process is polished, the piezoelectric ceramic is preferably heated at 1000° C. or more. The mechanically polished piezoelectric ceramic has the residual stress on the inside but the subsequent heat treatment at 1000° C. or more can relieve the residual stress to make the piezoelectric characteristic more favorable. The heat treatment also has an effect of removing the raw material powder of barium carbonate segregated in the grain boundary portion. The time of the heat treatment is not particularly limited but is preferably one hour or more.

Some of the calcined powder for forming the second crystal grain become the second crystal grain by the sintering while some other are taken in the first crystal grain. Depending on the sintering condition, the component of the first crystal grain leaks out to the grain boundary to make the second crystal grain grow.

The proportion of the second crystal grains in the surface or cross section of the piezoelectric ceramic can be controlled by, for example, the calcining condition for fabricating the calcined powder for forming the second crystal grain or the sintering condition of the piezoelectric ceramic.
(Piezoelectric Element)

Next, a piezoelectric element according to the present invention is described. FIG. 1 is a schematic view illustrating one embodiment of the structure of the piezoelectric element of the present invention. The piezoelectric element according to the present invention is a piezoelectric element including at least a first electrode 1, a piezoelectric ceramic portion 2, and a second electrode 3. The piezoelectric ceramic constituting the piezoelectric ceramic portion 2 corresponds to the piezoelectric ceramic according to the present invention.

The piezoelectric characteristic of the piezoelectric ceramic according to the present invention can be evaluated when the piezoelectric ceramic is made into the piezoelectric element including at least the first electrode and the second electrode. The first electrode and the second electrode are formed of a conductive layer with a thickness of approximately 5 nm to 10 μm. The material of the conductive layer is not particularly limited and may be any material that is usually used for the piezoelectric element. Examples of such a material include metal such as Ti, Pt, Ta, Ir, Sr, In, Sn, Au, Al, Fe, Cr, Ni, Pd, Ag, and Cu and a compound thereof.

The first electrode and the second electrode may be formed of one kind of those materials or may be formed by stacking two or more kinds thereof. The first electrode and the second electrode may be formed of different materials.

A fabrication method for the first electrode and the second electrode is not limited and may be burning of the metal paste, sputtering, vapor deposition, or the like. The first electrode and the second electrode may be patterned into a desired shape.
(Polarization)

The axes of polarization of the piezoelectric element are preferably uniform in a certain direction. When the axes of polarization are aligned in the certain direction, the piezoelectric constant of the piezoelectric element is large. The method of polarizing the piezoelectric element is not particularly limited. The polarization process may be performed in the atmosphere or in the silicone oil. The temperature in the polarization is preferably 60° C. to 150° C., though the temperature is not particularly limited because the optimum condition is a little different depending on the composition of the piezoelectric ceramic included in the element. The electric field to be applied in the polarization is preferably 800 V/mm to 2.0 kV/mm.
(Resonance-Antiresonance Method)

The piezoelectric constant and the mechanical quality factor of the piezoelectric element are calculated from the measurement results of the resonance frequency and the antiresonance frequency obtained by using a commercial impedance analyzer in accordance with the JEITA-EM-4501 (Standard of Japan 4 Electronics and Information Technology Industries Association). This method is hereinafter referred to as the resonance-antiresonance method.
(Multilayered Piezoelectric Element)

Next, a multilayered piezoelectric element according to the present invention is described. In this multilayered piezoelectric element, piezoelectric ceramic layers and electrode layers including an internal electrode are alternately stacked, and the piezoelectric ceramic layer is formed of the piezoelectric ceramic according to the present invention.

Figure 2A:
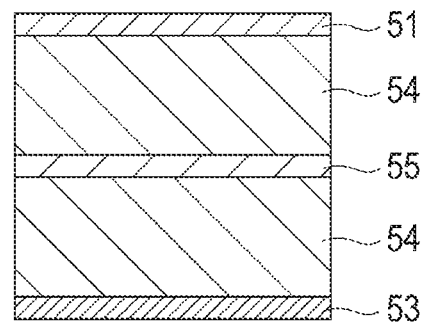
FIGS. 2A and 2B are schematic sectional views illustrating one embodiment of a structure of a multilayered piezoelectric element according to the present invention.
Figure 2B:
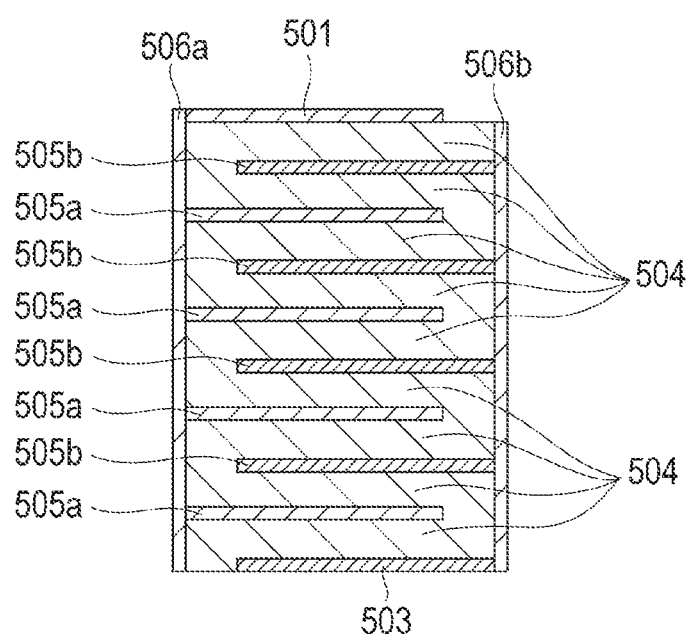

FIGS. 2A and 2B are schematic sectional views illustrating one embodiment of the structure of the multilayered piezoelectric element according to the present invention. This multilayered piezoelectric element includes piezoelectric ceramic layers 54 and electrode layers including an internal electrode 55, which are alternately stacked. The piezoelectric ceramic layer 54 is formed of the piezoelectric ceramic. The electrode layer may include an external electrode such as a first electrode 51 or a second electrode 53 in addition to the internal electrode 55.

FIG. 2A illustrates the structure of the multilayered piezoelectric element according to the present invention, in which the two-layer piezoelectric ceramic layers 54 are stacked with one layer of the internal electrode 55 interposed therebetween, and this multilayered structure is held between the first electrode 51 and the second electrode 53. As illustrated in FIG. 2B, the number of piezoelectric ceramic layers and internal electrodes may be increased without particular limitation. In the multilayered piezoelectric element in FIG. 2B, nine piezoelectric ceramic layers 504 and eight internal electrodes 505 (505a or 505b) are alternately stacked. This multilayered structure has the piezoelectric ceramic layer held by a first electrode 501 and a second electrode 503, and also has an external electrode 506a and an external electrode 506b for short-circuiting the internal electrodes that are alternately formed.

The size and shape of the internal electrodes 55 and 505, the external electrodes 506a and 506b, the first electrodes 51 and 501, and the second, electrodes 53 and 503 are not necessarily the same as those of the piezoelectric ceramic layers 54 and 504, and those electrodes may be divided into a plurality of sections.

The internal electrodes 55 and 505, the external electrodes 506a and 506b, the first electrodes 51 and 501, and the second electrodes 53 and 503 are formed of a conductive layer with a thickness of approximately 5 nm to 10 µm. The material thereof is not limited in particular and may be the material that is usually used for the piezoelectric element. For example, the metal such as Ti, Pt, Ta, Ir, Sr, In, Sn, Au, Al, Fe, Cr, Ni, Pd, Ag, or Cu or a compound thereof can be used. The internal electrodes 55 and 505 and the external electrodes 506a and 506b may be formed of one kind thereof, or a mixture, an alloy, or a stack containing any of those kinds. Alternatively, the plurality of electrodes may be formed of different materials.

The internal electrodes 55 and 505 contain Ag and Pd and the weight ratio M/M2 of the weight M1 of the contained Ag to the weight M2 of the contained Pd preferably satisfies $0.25 \leq M1/M2 \leq 4.0$, and more preferably $0.3 \leq M1/M2 \leq 3.0$. If the weight ratio M1/M2 is less than 0.25, the sintering temperature of the internal electrode is too high, which is not preferable. On the other hand, if the weight ratio MI/M2 is more than 4.0, the internal electrode has the island-like shape, so that the shape becomes inhomogeneous within the surface, which is not preferable either.

From the viewpoint of the inexpensive electrode material, the internal electrodes 55 and 505 preferably contain at least one kind of Ni and Cu. When the internal electrodes 55 and 505 contain at least one kind of Ni and Cu, the multilayered piezoelectric element according to the present invention is preferably sintered in a reductive atmosphere.

As illustrated in FIG. 2B, the plurality of electrodes including the internal electrode 505 may be short-circuited for the purpose of aligning the phase of the driving voltage. For example, the internal electrode 505a and the first electrode 501 may be short-circuited with the external electrode 506a. The internal electrode 505b and the second electrode 503 may be short-circuited with the external electrode 506b. The internal electrodes 505a and the internal electrodes 505b may be alternately disposed. How the electrodes are short-circuited is not particularly limited. A side surface of the multilayered piezoelectric element may be provided with an electrode or line for the short-circuiting, or the piezoelectric ceramic layer 504 may be penetrated to have a through-hole in which the conductive material is provided for the short-circuiting.

(Liquid Discharge Head)

Next, a liquid discharge head according to the present invention is described. The liquid discharge head includes at least a liquid chamber including a vibration portion provided with the piezoelectric element or the multilayered piezoelectric element, and a discharge port communicating with the liquid chamber.

Figure 3A:
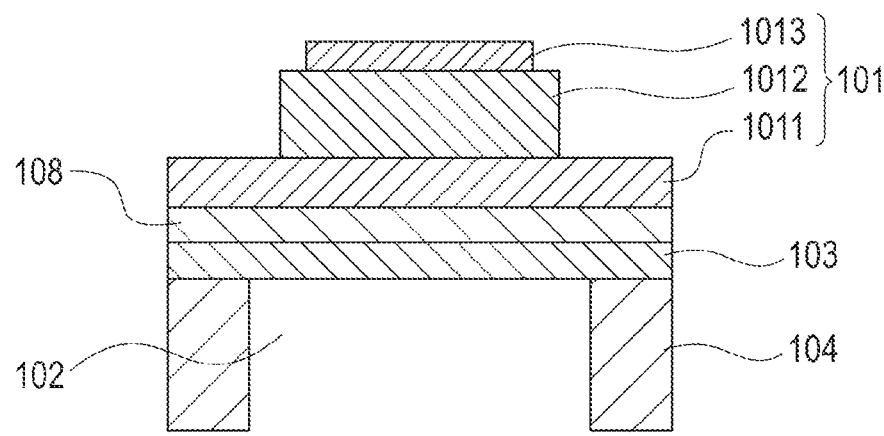
FIGS. 3A and 3B are schematic views illustrating one embodiment of a structure of a liquid discharge head according to the present invention.
Figure 3B:
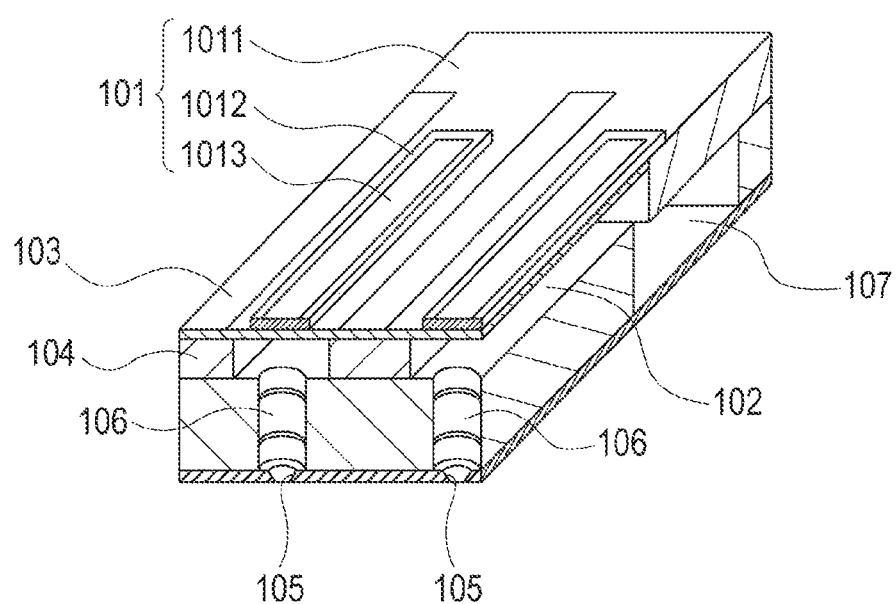

FIGS. 3A and 3B are schematic views illustrating one embodiment of the structure of the liquid discharge head according to the present invention. As illustrated in FIGS. 3A and 3B, the liquid discharge head according to the present invention includes a piezoelectric element 101 according to the present invention. The piezoelectric element 101 includes at least a first electrode 1011, a piezoelectric ceramic 1012, and a second electrode 1013. The piezoelectric ceramic 1012 is patterned as necessary as illustrated in FIG. 3B.

FIG. 3B is a schematic view of the liquid discharge head. The liquid discharge head includes discharge ports 105, separate liquid chambers 102, communication holes 106 each connecting between the separate liquid chamber 102 and the discharge port 105, liquid chamber partitions 104, a common liquid chamber 107, a vibration plate 103, and the piezoelectric element 101. In the diagram, the piezoelectric element 101 is rectangular but the shape may be other than rectangular, for example, elliptical, circular, or parallelogram. In general, the piezoelectric ceramic 1012 has the shape extending along the shape of the separate liquid chamber 102.

The portion around the piezoelectric element 101 included in the liquid discharge head according to the present invention is described in detail with reference to FIG. 3A. FIG. 3A is a sectional view of the piezoelectric element, which is illustrated in FIG. 3B, in a width direction thereof. The sectional shape of the piezoelectric element 101 is rectangular in the diagram but may be trapezoidal or inverted trapezoidal.

In the diagram, the first electrode 1011 is the lower electrode and the second electrode 1013 is the upper electrode. However, the arrangement of the first electrode 1011 and the second electrode 1013 is not limited thereto. For example, the first electrode 1011 may be used either as the lower electrode or as the upper electrode. Similarly, the second electrode 1013 may be used either as the upper electrode or the lower electrode. The vibration plate 103 and the lower electrode may have a buffer layer 108 held therebetween. The names may be different depending on the fabrication method for the device and in either case, the effect of the present invention is obtained.

In the liquid discharge head, the vibration plate 103 is vertically moved by the contraction and expansion of the piezoelectric ceramic 1012 to apply pressure to the liquid in the separate liquid chamber 102. This causes the discharge port 105 to discharge the liquid. The liquid discharge head according to the present invention can be used for a printer or in the fabrication of electronic devices.

The thickness of the vibration plate 103 is 1.0 μm or more and 15 μm or less, preferably 1.5 min or more and 8 μm or less. The material of the vibration plate is not limited but is preferably silicon. The silicon of the vibration plate may be doped with boron or phosphorus. The buffer layer or the electrode layer on the vibration plate may constitute a part of the vibration plate. The thickness of the buffer layer 108 is 5 nm or more and 300 nm or less, preferably 10 nm or more and 200 nm or less. The size of the discharge port 105 is 5 μm or more and 40 μm or less in average equivalent circular diameter. The shape of the discharge port 105 may be circular or a shape like a star, a rectangle, or a triangle.

(Liquid Discharge Device)

Next, a liquid discharge device according to the present invention is described. The liquid discharge device according to the present invention includes a placement portion for a transfer target body and the liquid discharge head.

Figure 4:
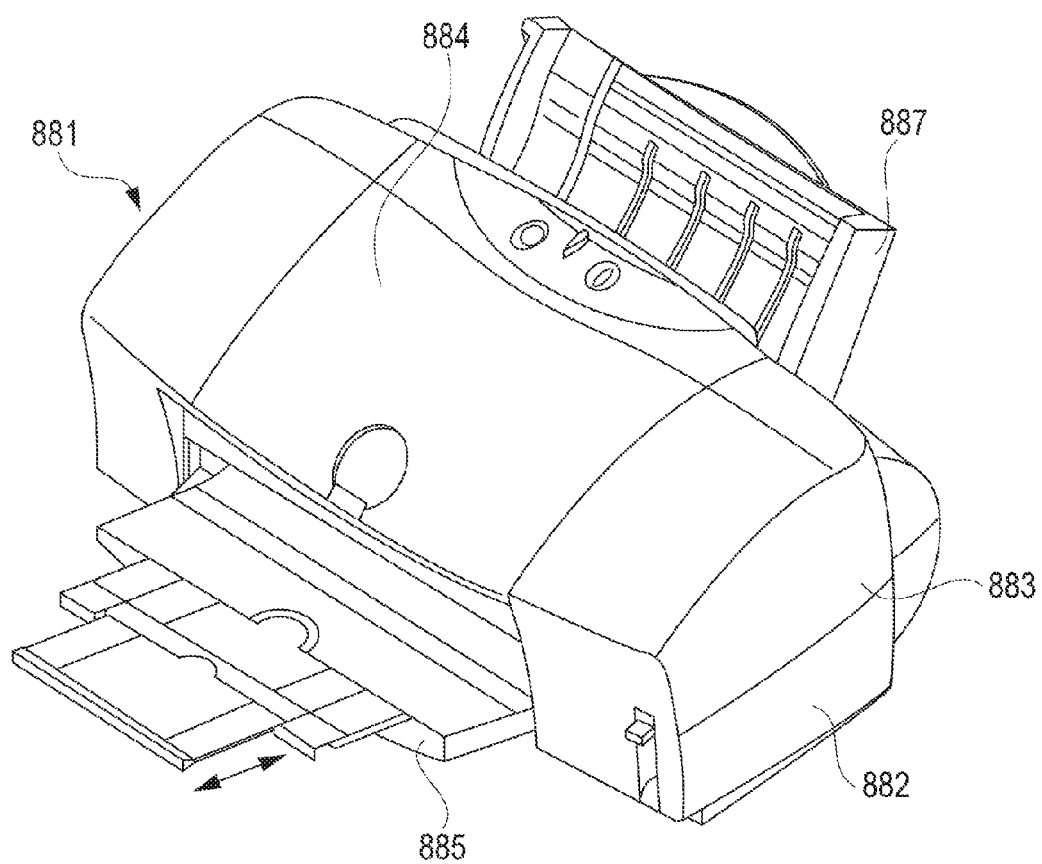
FIG. 4 is a schematic view illustrating one embodiment of a liquid discharge device according to the present invention.
Figure 5:
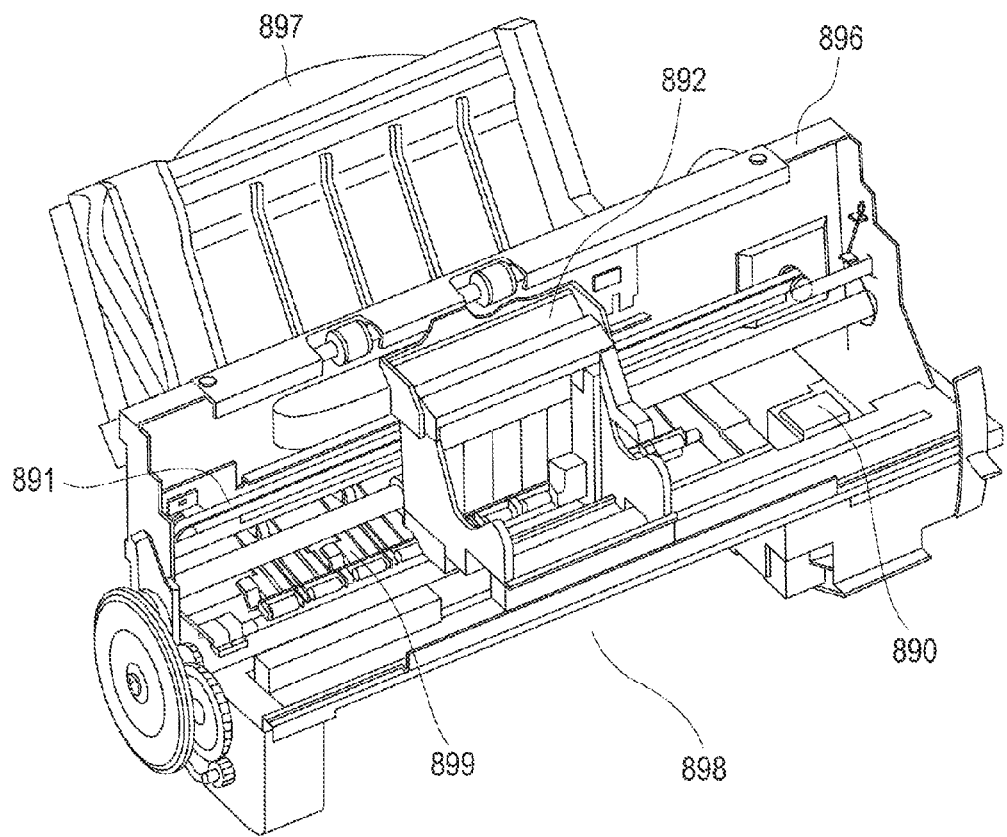
FIG. 5 is a schematic view illustrating another embodiment of the liquid discharge device according to the present invention.

An example of the liquid discharge device according to the present invention is an inkjet recording device illustrated in FIG. 4 and FIG. 5. FIG. 5 illustrates the state in which exteriors 882 to 885 and 887 are off from a liquid discharge device (inkjet recording device) 881 illustrated in FIG. 4. The inkjet recording device 881 has an automatic feeding portion 897 that automatically feeds recording paper, which is the transfer target body, into a device main body 896. In addition, the liquid discharge device 881 includes three portions that guide the recording paper, which is sent from the automatic feeding portion 897, to a predetermined recording position and moreover guiding the recording position to a discharge port 898.

That is to say, the inkjet recording device 881 includes a conveyance portion 899, which corresponds to the placement portion for the transfer target body, a recording portion 891 that records on the recording paper conveyed to the recording position, and a recovery portion 890 that performs a recovery process for the recording portion 891. The recording portion 891 includes a carriage 892 housing the liquid discharge head according to the present invention and reciprocating on a rail.

In the inkjet recording device as above, the carriage 892 is transported on the rail by the electric signals sent from the computer, and when the driving voltage is applied to the electrodes having the piezoelectric ceramic held therebetween, the piezoelectric ceramic is displaced. With the displacement of the piezoelectric ceramic, the pressure is applied to the separate liquid chamber 102 through the vibration plate 103 illustrated in FIG. 3B. This causes the discharge port 105 to discharge ink for the printing.

The liquid discharge device according to the present invention can discharge the liquid uniformly at high speed and can have a smaller size.

The above example describes the printer, and moreover, the liquid discharge device according to the present invention can be used for anther inkjet recording device for a facsimile device, a composite machine, or copier, or for the industrial liquid discharge devices.

In addition, the user can select a desired transfer target body in accordance with the intended purpose. The liquid discharge head can be moved relative to the transfer target body placed on the stage as the placement portion.

(Ultrasonic Motor)

Next, an ultrasonic motor according to the present invention is described. The ultrasonic motor according to the present invention includes at least a vibration body provided with the piezoelectric element or the multilayered piezoelectric element, and a mobile body in contact, with the vibration body.

Figure 6A:
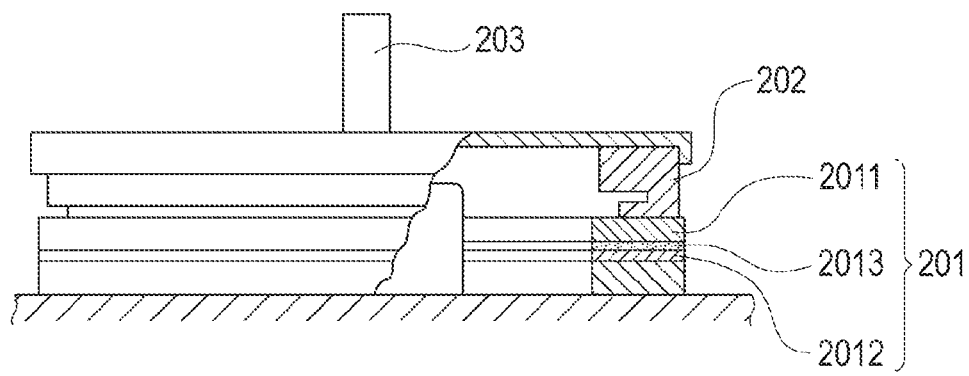
FIGS. 6A and 6B are schematic views illustrating one embodiment of a structure of an ultrasonic motor according to the present invention.
Figure 6B:
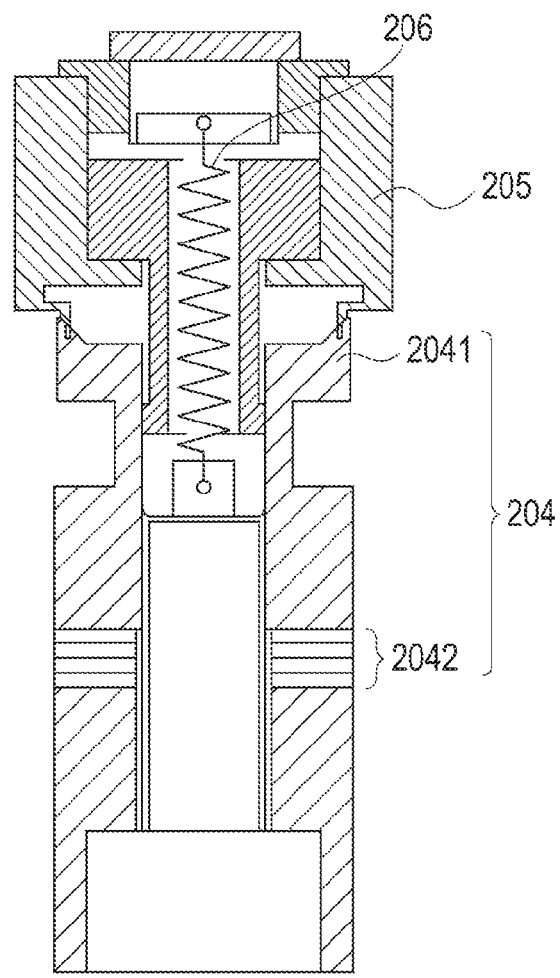

FIGS. 6A and 6B are schematic views illustrating one embodiment of the structure of the ultrasonic motor according to the present invention. FIG. 6A illustrates an ultrasonic motor in which the piezoelectric element according to the present invention includes a single plate. The ultrasonic motor includes a vibrator 201, a rotor 202 in contact with the sliding surface of the vibrator 201 with a pressing force from a pressing spring, which is not shown, and an output shaft 203 provided integrally for the rotor 202. The vibrator 201 includes an elastic ring 2011 of metal, a piezoelectric element 2012 according to the present invention, and an organic adhesive 2013 (epoxy or cyanoacrylate, for example) for attaching the piezoelectric element 2012 to the elastic ring 2011. The piezoelectric element 2012 according to the present invention includes a piezoelectric ceramic held between a first electrode and a second electrode, which are not shown.

When the two-phase alternating voltage whose phase is different by the odd number times of π/2 is applied to the piezoelectric element according to the present invention, a flexural traveling wave is generated in the vibrator 201 and each point on the sliding surface of the vibrator 201 carries out the elliptical motion. When the rotor 202 is in pressure contact with the sliding surface of the vibrator 201, the rotor 202 receives the friction force from the vibrator 201 and rotates in a direction opposite to the flexural traveling wave. The driven body, which is not shown, is bonded to the output shaft 203 and driven by the rotation force of the rotor 202.

When voltage is applied to the piezoelectric ceramic, the piezoelectric ceramic contracts or expands by the piezoelectric lateral effect. In the case where the elastic body such as metal is bonded to the piezoelectric element, the elastic body is bent by the contraction or expansion of the piezoelectric ceramic. The ultrasonic motor as described here uses this principle.

FIG. 6B illustrates an ultrasonic motor including the piezoelectric element having the multilayered structure. A vibrator 204 includes a multilayered piezoelectric element 2042 held by a cylindrical metal elastic body 2041. The multilayered piezoelectric element 2042 is an element including a plurality of stacked piezoelectric ceramics, which is not shown, and has a first electrode and a second electrode on the external surface of the multilayer and an internal electrode on the inner surface of the multilayer. The metal elastic body 2041 is fastened by a bolt and has the multilayered piezoelectric element 2042 held and fixed, so that the vibrator 204 is formed.

When the alternating voltage with the different phase is applied to the multilayered piezoelectric element 2042, the vibrator 204 excites the two vibrations that are orthogonal to each other. The two vibrations are synthesized to produce the circular vibration to drive the end portion of the vibrator 204. An upper part of the vibrator 204 is provided with a peripheral groove to increase the displacement of the vibration for the driving.

A rotor 205 is in pressure contact with the vibrator 204 by a pressing spring 206, thereby producing the friction force for the driving. The rotor 205 is rotatably supported by a bearing.

(Optical Appliance)

Next, an optical appliance according to the present invention is described. The optical appliance includes the ultrasonic motor in the driving portion.

Figure 7A:
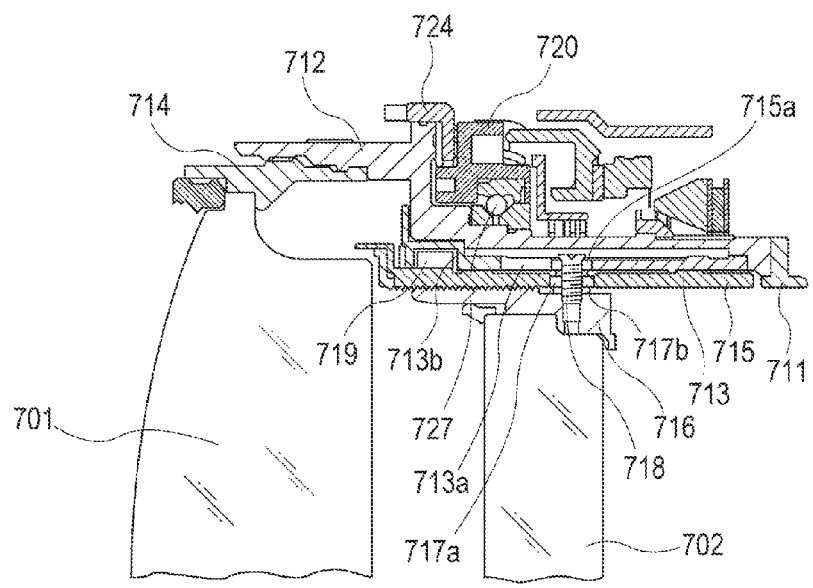
FIGS. 7A and 7B are schematic views illustrating one embodiment of an optical appliance according to the present invention.
Figure 7B:
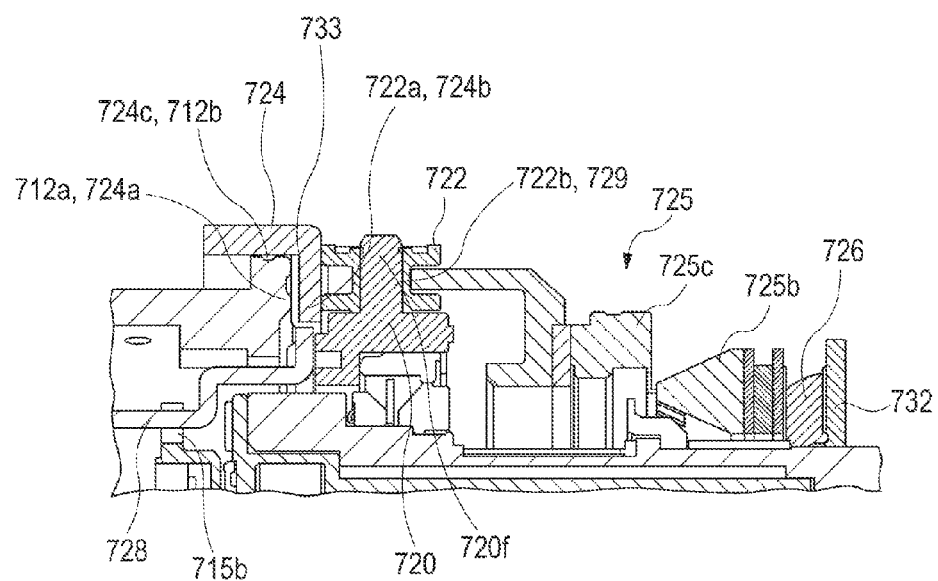
Figure 8:
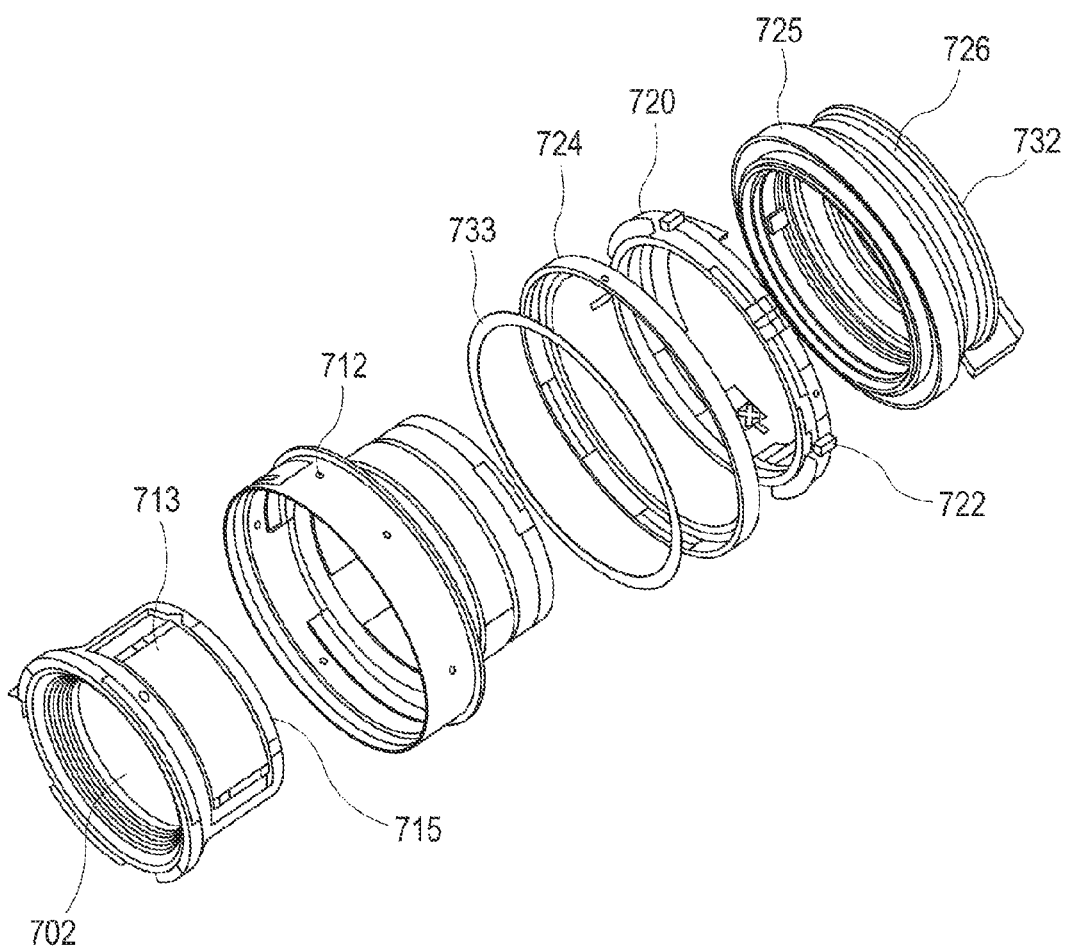
FIG. 8 is a schematic view illustrating another embodiment of the optical appliance according to the present invention.

FIGS. 7A and 7B are main sectional views of an exchangeable lens barrel of a single lens reflex camera, which corresponds to an example of a preferred embodiment of the optical appliance according to the present invention. FIG. 8 is an exploded perspective view of an exchangeable lens barrel of a single lens reflex camera, which corresponds to an example of a preferred embodiment of the optical appliance according to the present invention. On a detachable mount 711 for the camera, a fixing barrel 712, a straight advance barrel 713, and a front group lens barrel 714 are fixed. These components are to fix the exchangeable lens barrel.

The straight advance barrel 713 is provided with a straight advance guide groove 713a in an optical axis direction for a focusing lens 702. On a rear group lens barrel 716 that holds the focusing lens 702, cam rollers 717a and 717b projecting outward in a radial direction are fixed with an axial screw 718. The cam roller 717a is fitted to the straight advance guide groove 713a.

To the inner periphery of the straight advance barrel 713, a cam ring 715 is rotatably fitted. When a roller 719 fixed to the cam ring 715 is fitted to a peripheral groove 713b of the straight advance barrel 713, the relative movement in the optical axis direction between the straight advance barrel 713 and the cam ring 715 is restricted. The cam ring 715 is provided with a cam groove 715a for the focusing lens 702, and the cam roller 717b is fitted to the cam groove 715a at the same time.

A rotation transmitting ring 720, which is held so that the rotation about the fixed position is possible relative to the fixing barrel 712 by a ball lace 727, is disposed on the outer peripheral side of the fixing barrel 712. The rotation transmitting ring 720 holds a roller 722 rotatably on a shaft 720f radially extending from the rotation transmitting ring 720. A large-diameter portion 722a of this roller 722 is in contact with a mount-side end face 724b of a manual focus ring 724. A small-diameter portion 722b of the roller 722 is in contact with a bonding member 729. Six rollers 722 are in contact with the outer periphery of the rotation transmitting ring 720 at even intervals, and those rollers are structured to satisfy the above relation.

The inner diameter portion of the manual focus ring 724 is provided with a low-friction sheet (washer member) 733. This low-friction sheet is held between a mount-side end face 712a of the fixing barrel 712 and a front end face 724a of the manual focus ring 724. The outer diameter surface of the low-friction sheet 733 has the ring-like shape and has the circumference fitted to that of an inner diameter 724c of the manual focus ring 724. Moreover, the inner diameter 724c of the manual focus ring 724 has the circumference fitted to that of an outer diameter portion 712b of the fixing barrel 712. The low-friction sheet 733 plays a role of reducing the friction in the rotation ring mechanism in the structure that the manual focus ring 724 rotates around the optical axis relative to the fixing barrel 712.

The large-diameter potion 722a of the roller 722 and the mount-side end face 724b of the manual focus ring are in contact with each other with the pressing force applied thereto, the pressing force being generated when a wave washer 726 pushes an ultrasonic motor 725 to the front of the lens. Similarly, the small-diameter portion 722b of the roller 722 and the bonding member 729 are also in contact with each other with the appropriate pressing force applied thereto, the pressing force being generated when the wave washer 726 pushes the ultrasonic motor 725 to the front of the lens. The movement of the wave washer 726 in the mount direction is restricted by a washer 732 bonded with bayonet to the fixing barrel 712. The spring force (energizing power) generated by the wave washer 726 is transmitted to the ultrasonic motor 725 and moreover to the roller 722, and also causes the manual focus ring 724 to press the mount-side end face 712a of the fixing barrel 712. That is to say, the manual focus ring 724 is incorporated while the ring 724 is pressed against the mount-side end face 712a of the fixing barrel 712 through the low-friction sheet 733.

Thus, since the bonding member 729 is in friction contact with the small-diameter portion 722b of the roller 722, rotating and driving the ultrasonic motor 725 relative to the fixing barrel 712 by a control unit, which is not shown, causes the roller 722 to rotate around the shaft 720f. The rotation of the roller 722 around the shaft 720f accordingly causes the rotation transmitting ring 720 to rotate around the optical axis (auto-focusing operation).

Moreover, applying the rotation force around the optical axis to the manual focus ring 724 from a manual operation input unit, which is not shown, causes the operation as below.

That is to say, since the mount-side end face 724b of the manual focus ring 724 is in pressure contact with the large-diameter portion 722a of the roller 722, the friction force causes the roller 722 to rotate around the shaft 720f. The rotation of the large-diameter portion 722a of the roller 722 around the shaft 720f causes the rotation transmitting ring 720 to rotate around the optical axis. Bere, the ultrasonic motor 725 is not rotated because of the friction retention force between a rotor 725c and a stator 725b (manual focusing operation).

The rotation transmitting ring 720 is provided with two focus keys 728 at the opposite positions, and the focus key 728 is engaged with a cut portion 715b at the end of the cam ring 715. Therefore, when the rotation transmitting ring 720 is rotated around the optical axis in accordance with the auto-focusing operation or the manual focusing operation, the rotation force is transmitted to the cam ring 715 through the focus key 728. The rotation of the cam ring around the optical axis causes the rear group lens barrel 716 whose rotation is restricted by the cam roller 717a and the straight advance guide groove 713a to retract along the cam groove 715a of the cam ring 715 by the cam roller 717b. This drives the focusing lens 702 and performs the focusing operation.

The optical appliance according to the present invention is exchangeable lens barrel of the single lens reflex camera in the above description but may alternatively be other optical appliances having the ultrasonic motor in the driving portion, such as the compact camera or the electronic still camera, regardless of the type of camera.

(Vibration Device and Dust Removing Device)

Vibration devices used in transporting or removing particles, powder, or liquid, for example, have widely been used in electronic appliances, etc. A dust removing device including the piezoelectric element according to the present invention is hereinafter described as one example of the vibration device according to the present invention.

The dust removing device according to the present invention includes at least a vibration body provided with the piezoelectric element or the multilayered piezoelectric element on a vibration plate, and has a function of removing the dust from the surface of the vibration plate.

Figure 9A:
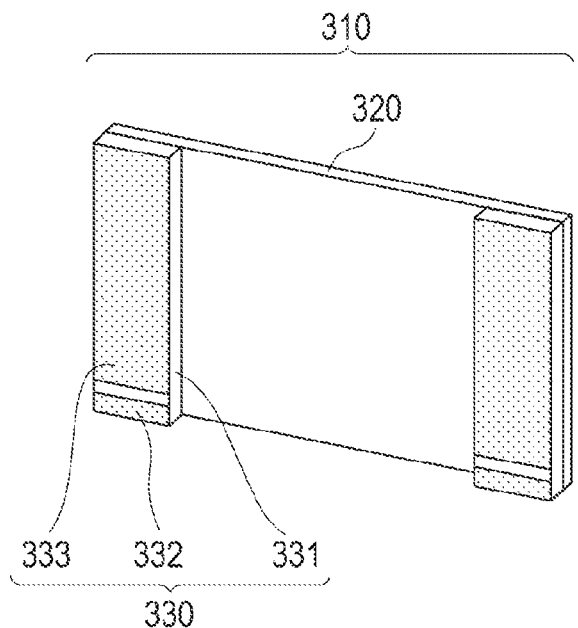
FIGS. 9A and 9B are schematic views illustrating one embodiment of a vibration device according to the present invention that is used as a dust removing device.
Figure 9B:
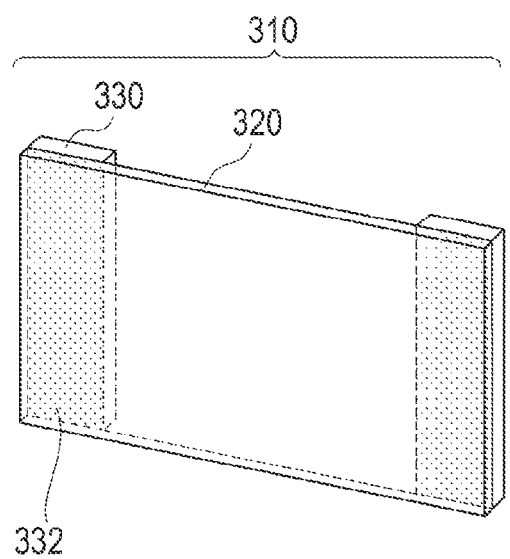

FIGS. 9A and 9B are schematic views illustrating one embodiment of the dust removing device according to the present invention. A dust removing device 310 includes a plate-shaped piezoelectric element 330 and a vibration plate 320. The piezoelectric element 330 may be the multilayered piezoelectric element according to the present invention. The material of the vibration plate 320 is not limited, and if the dust removing device 310 is used for an optical device, a light-transmitting material or a light-reflecting material can be used for the vibration plate 320. In this case, the light-transmitting portion or the light-reflecting portion of the vibration plate is the target from which the dust is to be removed.

Figure 10:
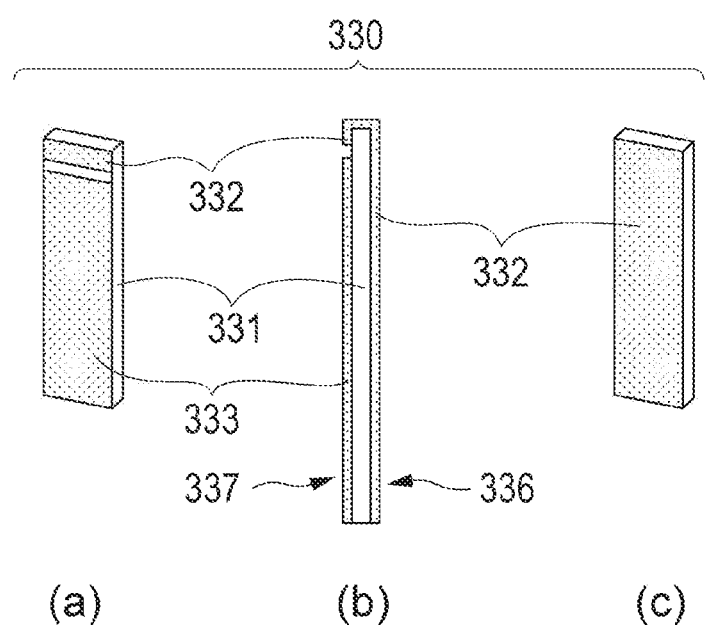
FIG. 10 is a schematic view illustrating a structure of a piezoelectric element in the dust removing device according to the present invention.

FIG. 10 is a schematic view illustrating the structure of the piezoelectric element 330 in FIGS. 9A and 9B. (a) and (c) of FIG. 10 illustrate the structure of front and rear surfaces of the piezoelectric element 330, and (b) of FIG. 10 illustrates the structure of a side surface thereof. As illustrated in FIGS. 9A and 9B (FIG. 10), the piezoelectric element 330 includes a piezoelectric ceramic 331, a first electrode 332, and a second electrode 333. The first electrode 332 and the second electrode 333 are disposed opposite to each other on the plate surface of the piezoelectric ceramic 331. In a manner similar to FIGS. 9A and 9B, the piezoelectric element 330 may be the multilayered piezoelectric element according to the present invention. In this case, the piezoelectric ceramic 331 has the structure in which the piezoelectric ceramic layer and the internal electrode are alternately stacked, and the internal electrode is short-circuited with the first electrode 332 or the second electrode 333 alternately, so that the driving waveform with a different phase can be applied for each layer of the piezoelectric ceramic. In (c) of FIG. 10, the surface where the first electrode 332 is disposed before the piezoelectric element 330 is a first electrode surface 336; in (a) of FIG. 10, the surface where the second electrode 333 is disposed before the piezoelectric element 330 is a second electrode surface 337.

The electrode surface is the surface of the piezoelectric element where the electrode is provided, and for example, the first electrode 332 may extend to reach the second electrode surface 337 as illustrated in FIG. 10.

In regard to the piezoelectric element 330 and the vibration plate 320, the first electrode surface 336 of the piezoelectric element 330 is fixed to the plate surface of the vibration plate 320 as illustrated in FIGS. 9A and 91B. Driving the piezoelectric element. 330 produces the stress between the piezoelectric element 330 and the vibration plate 320, thereby causing the out-of-plane vibration in the vibration plate. The dust removing device 310 according to the present invention is the device that removes the undesired substance such as dust on the surface of the vibration plate 320 with the out-of-plane vibration of the vibration plate 320. The out-of-plane vibration refers to the elastic vibration that displaces the vibration plate in the optical axis direction, i.e., a thickness direction of the vibration plate.

Figure 11:
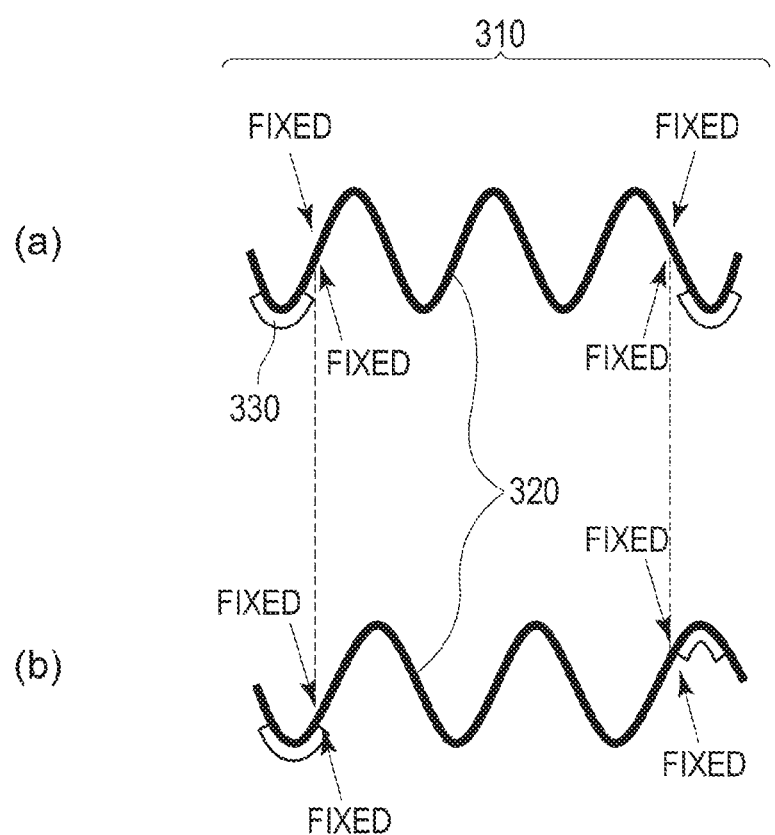
FIG. 11 is a schematic diagram illustrating the vibration principle of the dust removing device according to the present invention.

FIG. 11 is a schematic diagram illustrating the principle of vibration of the dust removing device 310 according to the present invention. (a) of FIG. 11 is a schematic diagram in which the dust removing device 310 is observed from the direction of the thickness of the vibration plate 320 in the state that alternating voltage with the same phase is applied to a pair of right and left piezoelectric elements 330 to cause the out-of-plane vibration in the vibration plate 320. The polarization direction of the piezoelectric ceramic included in the pair of right and left piezoelectric elements 330 is the same as the thickness direction of the piezoelectric element 330. The dust removing device 310 is driven in the seventh oscillation mode. (b) of FIG. 11 illustrates the state in which the alternating voltage with the opposite phases, whose phases are opposite by 180°, is applied to the pair of right and left piezoelectric elements 330 to cause the out-of-plane vibration in the vibration plate 320. The dust removing device 310 is driven in the sixth vibration mode. The dust removing device 310 according to the present invention is the device that can remove the dust from the surface of the vibration plate effectively by separately using at least two vibration modes.

(Imaging Device)

Figure 12:
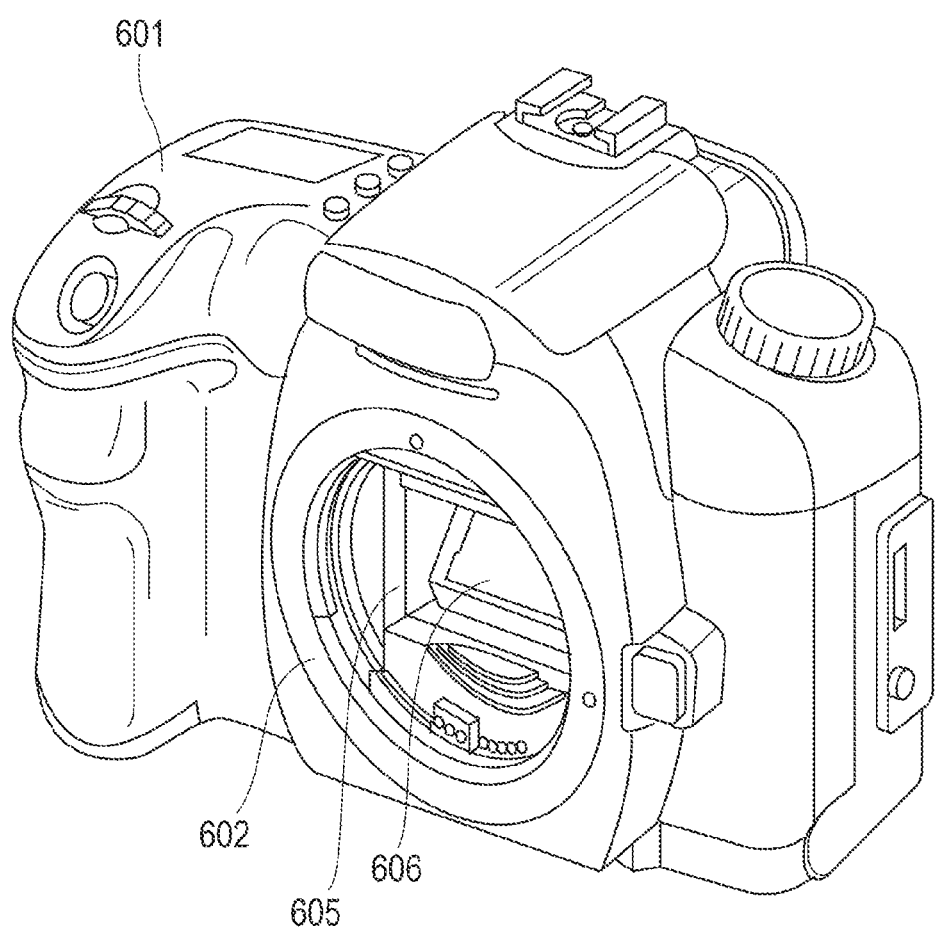
FIG. 12 is a schematic view illustrating one embodiment of an imaging device according to the present invention.

Next, an imaging device according to the present invention is described. The imaging device includes at least the dust removing device and an imaging element unit. The vibration plate of the dust removing device is provided on the light-receiving surface side of the imaging element unit. FIG. 12 and FIG. 1.3 illustrate a digital single lens reflex camera corresponding to one example of the preferred embodiment of the imaging device of the present invention.

Figure 13:
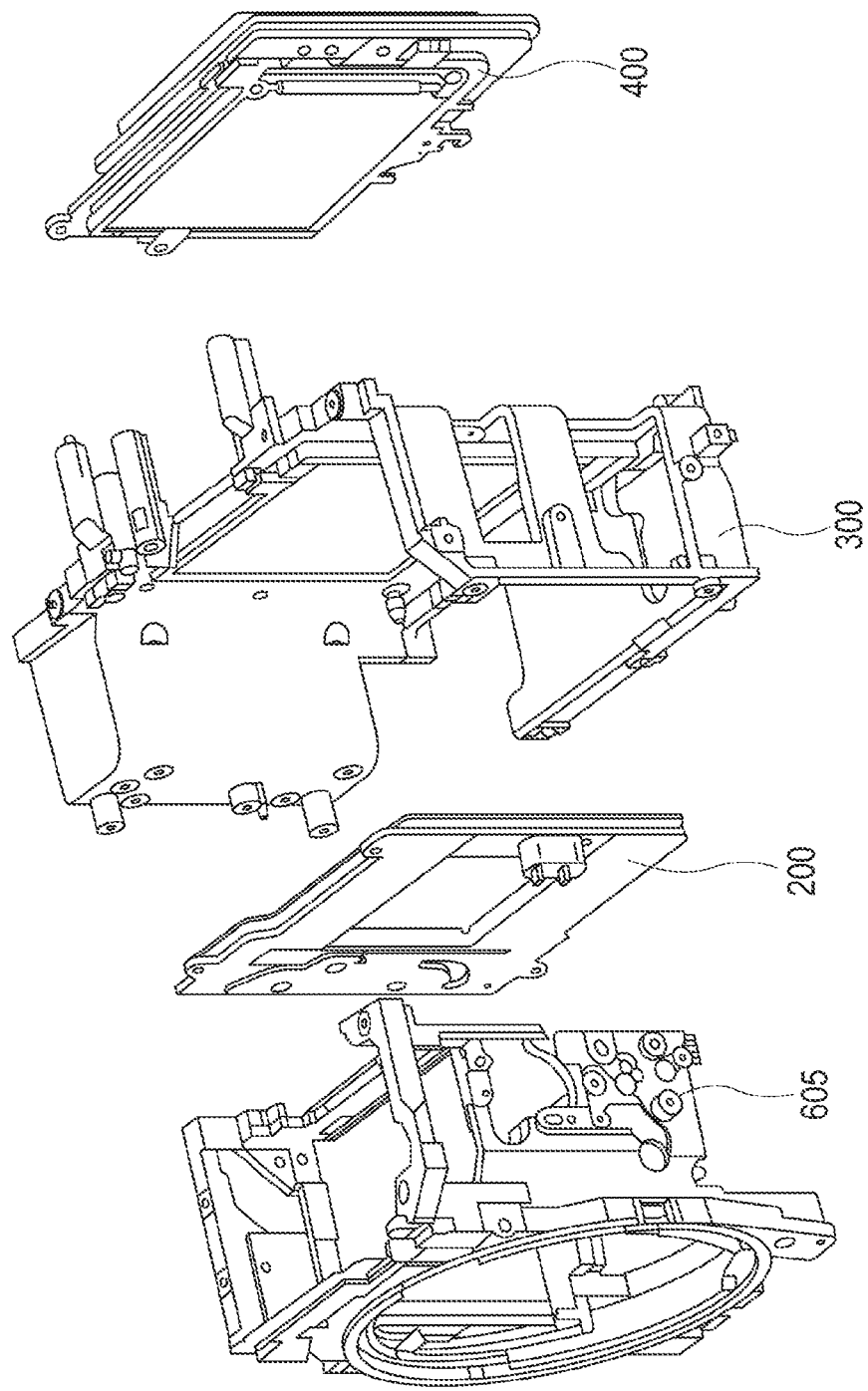
FIG. 13 is a schematic view illustrating another embodiment of the imaging device according to the present invention.

FIG. 12 is a front-side perspective view in which a camera main body 601 from which a photographing lens unit has been removed is viewed from a subject side. FIG. 13 is an exploded perspective view illustrating the schematic structure of the inside of the camera for describing the peripheral structure of the dust removing device according to the present invention and an imaging unit 400.

Inside the camera main body 601 illustrated in FIG. 12, a mirror box 605 is provided. To the mirror box 605, a light beam having passed the photographing lens is guided. Inside the mirror box 605, a main mirror (quick return mirror) 606 is disposed. The main mirror 606 can be set to the state in which the mirror 606 is maintained at 45° relative to the photographing optical axis for guiding the light beam to a pentagonal mirror (not shown) or the state in which the mirror 606 is retracted from the light beam for guiding the light beam in a direction to the imaging element (not shown)

In FIG. 13, the mirror box 605 and a shutter unit 200 are provided in order from the subject side, on the subject side of a main body chassis 300 constituting the framework of the camera main body. On the photographer side of the main body chassis 300, the imaging unit 400 is provided. The imaging unit 400 includes the vibration plate of the dust removing device and the imaging element unit. The vibration plate of the dust removing device is provided on the same axis as the light-receiving surface of the imaging element unit. The imaging unit 400 is provided on the attachment surface of a mount portion 602 (FIG. 12) based on which the photographing lens unit is attached. The imaging unit 400 is adjusted so that the imaging surface of the imaging element unit is parallel to the photographing lens unit with a predetermined distance therebetween.

Here, the digital single lens reflex camera has been described as the imaging device according to the present invention; however, the imaging device may be a photographing lens unit interchangeable camera without the mirror box 605, such as the mirrorless digital single lens camera. Moreover, the present invention can be applied to other imaging devices including an imaging lens unit interchangeable video camera, a copier, a facsimile device, and a scanner, or electronic and electric appliances including the imaging devices, particularly the appliance in which the dust on the surface of the optical component needs to be removed.

(Electronic Appliance)

Next, an electronic appliance according to the present invention is described. The electronic appliance includes a piezoelectric acoustic component including the piezoelectric element or the multilayered piezoelectric element. The piezoelectric acoustic component includes a speaker, a buzzer, a microphone, and a surface acoustic wave (SAW) element.

Figure 14:
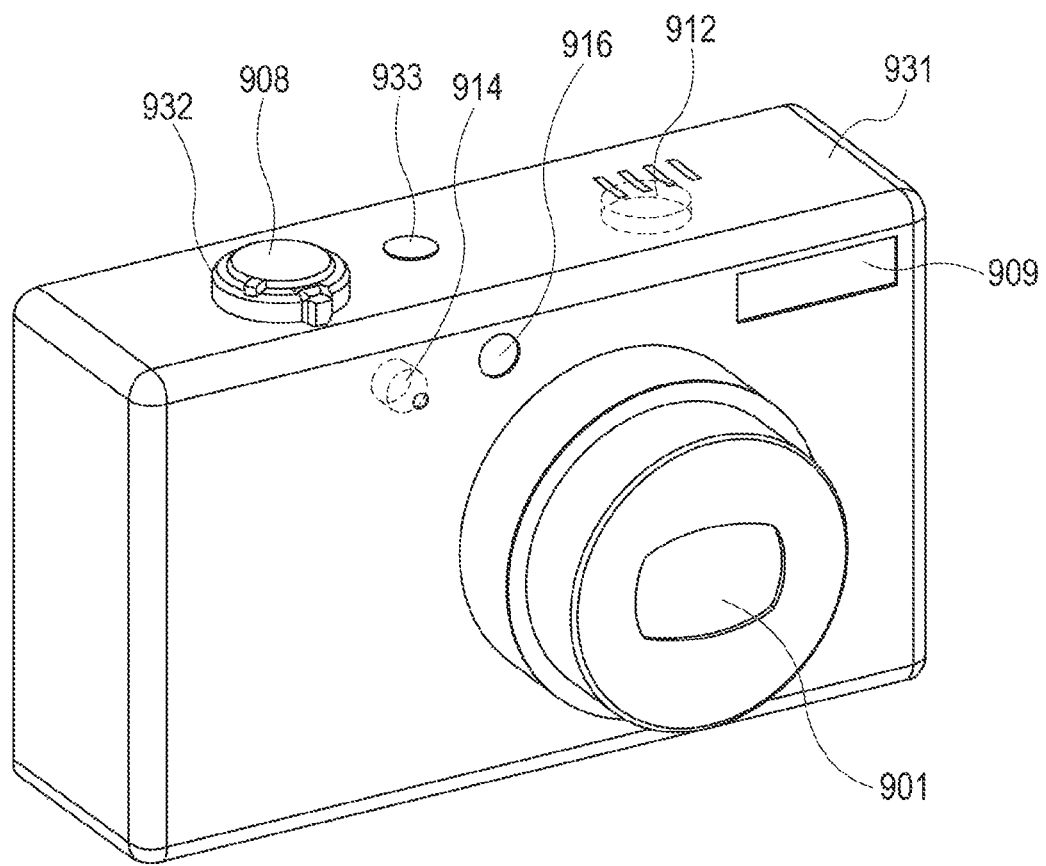
FIG. 14 is a schematic view illustrating one embodiment of an electronic appliance according to the present invention.

FIG. 14 is an overall perspective view in which a digital camera corresponding to one example of the preferred embodiment of the electronic appliance according to the present invention is viewed from the front of a main body 931 of the digital camera. On the front surface of the main body 931, an optical device 901, a microphone 914, a strobe light emission portion 909, and an assistant light portion 916 are disposed. The microphone 914 is incorporated in the main body and is shown by a dashed line. The front part of the microphone 914 has a hole for collecting the sound from the outside.

An upper surface of the main body 931 includes a power button 933, a speaker 912, a zoom lever 932, and a release button 908 for executing the focusing operation. The speaker 912 is incorporated in the main body 931, and is shown by a dashed line. The front, part of the speaker 912 has a hole for conveying the sound to the outside.

The piezoelectric acoustic component according to the present invention is used for at fleast one of the microphone 914, the speaker 912, and the surface acoustic element.

Here, the digital camera has been described as the electronic appliance of the present invention; however, the electronic appliance of the present invention can be used for a sound reproducing appliance, a sound recording appliance, a mobile phone, an information terminal, or other electronic appliances having the piezoelectric acoustic component.

As described above, the piezoelectric element and the multilayered piezoelectric element according to the present invention can be used suitably for the liquid discharge head, the liquid discharge device, the ultrasonic motor, the optical appliance, the vibration device, the dust removing device, the imaging device, and the electronic appliance.

By the use of the piezoelectric element and the multilayered piezoelectric element according to the present invention, the liquid discharge head with the nozzle density and the discharge speed that are higher than or equal to those of the piezoelectric element including lead can be provided.

By the use of the liquid discharge head according to the present invention, the liquid discharge device with the discharge speed and the discharge accuracy that are higher than or equal to those of the piezoelectric element including lead can be provided.

By the use of the piezoelectric element and the multilayered piezoelectric element according to the present invention, the ultrasonic motor with the driving power and the durability that are higher than or equal to those of the piezoelectric element including lead can be provided.

By the use of the ultrasonic motor according to the present invention, the optical appliance with the durability and the operation accuracy that are higher than or equal to those of the piezoelectric element including lead can be provided.

By the use of the piezoelectric element and the multilayered piezoelectric element according to the present invention, the vibration device with the vibration capability and the durability that are higher than or equal to those of the piezoelectric element including lead can be provided.

By the use of the vibration device according to the present invention, the dust removing device with the dust removing efficiency and the durability that are higher than or equal to those of the piezoelectric element including lead can be provided.

By the use of the dust removing device according to the present invention, the imaging device with the dust removing function which is higher than or equal to that of the piezoelectric element including lead can be provided.

By the use of the piezoelectric acoustic component having the piezoelectric element and the multilayered piezoelectric element according to the present invention, the electronic appliance with the sounding property which is higher than or equal to that of the piezoelectric element including lead can be provided.

The piezoelectric ceramic according to the present invention can be used for, in addition to the liquid discharge head and the motor, the piezoelectric devices such as the ultrasonic vibrator, the piezoelectric actuator, the piezoelectric sensor, the ferroelectric memory, and the power generation device.

Figure 16A:
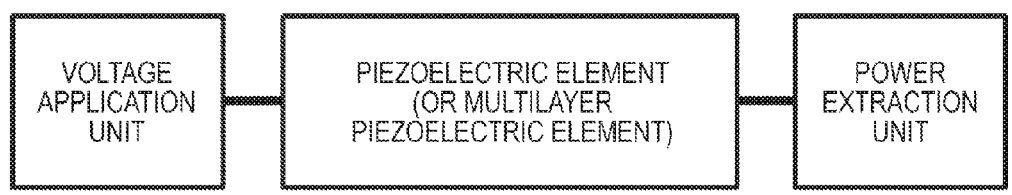
FIGS. 16A to 16C are schematic diagrams illustrating one embodiment of a piezoelectric device according to the present invention.
Figure 16B:
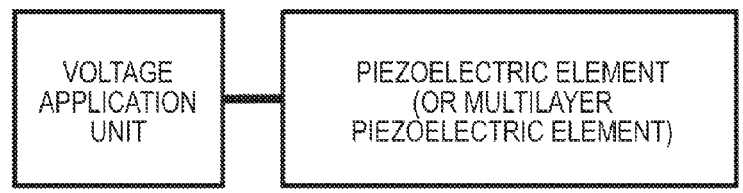
Figure 16C:
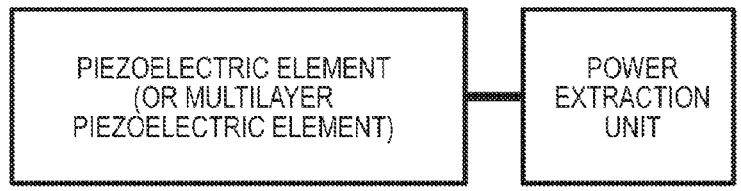

The piezoelectric device according to the present invention includes the piezoelectric element or the multilayered piezoelectric element according to the present invention as illustrated in FIGS. 16A to 16C, and has at least one of a voltage application unit and a power extraction unit relative to the piezoelectric element or the multilayered piezoelectric element. "Power extraction" refers to either getting the electric energy or receiving electric signals.

EXAMPLES

The present invention are hereinafter described in more details with reference to Examples. The present invention is, however, not limited by Examples below.

Example 1

Fabrication of Raw Material of Piezoelectric Ceramic

As for the raw material, barium carbonate ($BaCO_3$) powder (purity 99.9% or more) was prepared as the Ba material, calcium carbonate ($CaCO_3$) powder (purity 99.9% or more) was prepared as the Ca material, bismuth oxide ($Bi_2O_3$) powder (purity 99.9% or more) was prepared as the Bi material, titanate oxide ($TiO_2$) powder (purity 99.9% or more) was prepared as the Ti material, zircon oxide ($ZrO_2$) powder (purity 99.9% or more) was prepared as the Zr material, and trimanganese tetraoxide ($Mn_3O_4$) powder (purity 99.5% or more) was prepared.

The materials were weighed so that Ba, Ca, Ti, and Zr satisfy the composition $(Ba_{0.860}Ca_{0.140})_{1.000}(Ti_{0.930}Zr_{0.070})O_3$. Then, the materials were heated for five hours at 1000° C. in an electric furnace. Thus, the calcined powder for forming the first crystal grain was fabricated. Next, the Ba material and the Ti material were weighed so that $Ba_4Ti_2O_{27}$ is satisfied and then heated for five hours at 1000° C., thereby fabricating the calcined powder for forming the second crystal grain.

Relative to 100 parts by weight of the calcined powder for forming the first crystal grain, 0.5 parts by weight of the calcined powder for forming the second crystal grain was added to fabricate the mixed powder. The Ba material and the Ca material were added so that, the ratio of the molar amount of Ba and Ca to the molar amount of Ti and Zr in the mixed powder became 1.002, thereby fabricating the adjusted mixed powder. Moreover, relative to 100 parts by weight of the adjusted mixed powder, the Bi material and the Mn material were added so that Bi constitutes 0.170 parts by weight and Mn constitutes 0.150 parts by weight on a metal basis. The mixed powder was then further mixed using a ball mill in the dry method for 24 hours, thereby fabricating the mixed calcined powder.

Next, 3 mass % of PVA was added as the binder to the mixed calcined powder; specifically, the surface of the mixed calcined powder was sprayed with the binder using a spray dryer device. Thus, granulated powder with the binder attached to the surface of the mixed calcined powder was fabricated.

(Fabrication of Piezoelectric Ceramic)

Next, a mold was filled with the granulated powder and pressed using a press molding machine. Thus, a molded body was obtained. The obtained molded body was put into an electric furnace. Under the condition in which the temperature was increased gradually from 1000° C. and maintained at 1310° C. for five hours, the sintered body (polycrystalline piezoelectric ceramic) was fabricated.

(Analyzing Method for Piezoelectric Ceramic)

The composition of the fabricated piezoelectric ceramic was evaluated using ICP optical emission spectrometry. The x-value, y-value, and a-value in Table 1 are the analysis values after the sintering, which respectively correspond to the amount of Ca, the amount of Zr, and the ratio of the molar amount of Ba and Ca to the molar amount of Ti and Zr in General Formula $(Ba_{1-x}Ca_x)_a(Ti_{1-y}Zr_y)O_3$. The amount of Mn and the amount of Bi in Table 1 are the values obtained by converting the amount of Mn and the amount of Bi included in the piezoelectric ceramic according to the analysis into metal weight relative to 100 parts by weight of the metal oxide represented by General Formula (1) that is similarly identified by the analysis. In this example, the preparation ratio of the material coincides with the analysis value after the sintering.

The surface of the piezoelectric ceramic was mirror polished and then analyzed using the X-ray diffraction (XRD). The results indicate that the tetragonal crystal system with the perovskite structure is the main phase.

A metal or carbon film was stacked on the mirror polished surface of the piezoelectric ceramic, and an analysis sample with a thickness of 1 μm, a width of 10 μm, and a length of 5 μm was cut out of the piezoelectric ceramic surface using a focused ion beam. This sample was attached to a grid of the transmission electron microscope (TEM) and irradiated with the focused ion beam in parallel to the length direction of the sample. Thus, the sample thickness was approximately 100 nm in a region with a width of 5 μm.

The analysis sample was irradiated with an electron beam in the thickness direction and the composition analysis by the STEM-EDX was conducted, and the electron beam diffraction image was acquired by the selected area electron diffraction method. By comparing the composition information obtained from the composition analysis and the distance between the lattice planes obtained from the electron beam diffraction image with the public reference data, the metal oxide as the main component of the second crystal grain was identified. Similarly, the electron beam diffraction image of the first crystal grain was acquired and the results indicate that the first crystal grain has the perovskite structure.

Table 1 shows the presence or absence of Mn in the main component of the second crystal grain according to STEM-EDX. In Table 1, 0 represents that Mn is present in the main component of the second crystal grain and X represents that Mn is absent, in the main component thereof.

The results of analyzing the compositions by the STEM-EDX indicate that the grain boundary of the first crystal grains does not include the area where the Mn component is segregated other than in the main component of the second crystal grain. Moreover, manganese oxide was not present.

The composition of the first crystal grain in contact with the second crystal grain, and the composition of the first crystal grain not in contact with the second crystal grain were analyzed using the STEM-EDX or the SEM-WDX of the mirror polished surface of the piezoelectric ceramic having a carbon film stacked thereon. Based on the analysis results, the ratio A1/B1 of the molar number A1 of Ba and Ca to the molar number B1 of Ti and Zr in the first crystal grains in contact with the second crystal grain and the ratio A2/B2 of the molar number A2 of Ba and Ca to the molar number B2 of Ti and Zr in the first crystal grains not in contact with the second crystal grain were calculated. The results are shown in Table 1.

The average equivalent circular diameter of the crystal grain was obtained by analyzing the observation image from the polarization microscope or the scanning electron microscope (SEM) using image processing software. The relative density was obtained based on the density measured by Archimedes' method.

The proportion (area %) of the second crystal grains in the entire area of the surface or cross section was obtained by the SEM observation on the surface or cross section of the piezoelectric ceramic. Specifically, using the contrast difference in the SEM images between the first crystal grains and the second crystal grains, the total area of the second crystal grains in the observation field was calculated through the binarizing image processing. Thus, the proportion (area %) of the second crystal grains in the area of the observation field of view was obtained. The results of measuring the average equivalent circular diameter and the relative density of the first crystal grains are shown in Table 1.

(Fabrication of Piezoelectric Element)

The obtained piezoelectric ceramic was polished so that the thickness became 0.5 mm. Then, an electrode was formed on each of front and back surfaces of the piezoelectric ceramic by a DC sputtering method. Specifically, a titanium film with a thickness of 30 nm was formed as a contact layer, and then a gold film with a thickness of 400 nm was formed. This piezoelectric ceramic with the electrodes were cut to form a piezoelectric element with a size of 10 mm×2.5 mm×0.5 mm with the structure illustrated in FIG. 1.

This element was placed on a hot plate with a surface temperature ranging from 110° C. to 140° C., and the DC voltage was applied for 30 minutes to the electrodes on both surfaces of the piezoelectric element so that the electric field intensity was 1.0 kV/mm. After that, the polarization process was carried out in which the temperature was reduced to room temperature while the voltage is applied.

(Evaluation of Mechanical Quality Factor, Piezoelectric Constant, and Resistivity)

The piezoelectric element was set in a thermostat tank whose atmosphere was adjusted to be 0° C., and the resonance frequency and antiresonance frequency of the piezoelectric element were obtained using a commercial impedance analyzer. From the measurement results, the mechanical quality factor and the piezoelectric constant. ($d_{31}$) according to the present invention were calculated based on the JEITA-EM-4501 (Standard of Japan Electronics and Information Technology Industries Association).

For evaluating the insulating property, the resistivity was measured. The resistivity was measured at room temperature (25° C.) using an unpolarized piezoelectric element. The DC voltage of 10 V was applied between two electrodes of the piezoelectric element and the leak current value after 20 seconds was measured, based on which the resistivity was calculated.

Table 1 shows the mechanical quality factor at 0° C., the absolute value $|d_{31}|$ of the piezoelectric constant $d_{31}$ at 0° C., and the resistivity at the room temperature. When the mechanical quality factor is smaller, more power is consumed to drive the piezoelectric element as the resonance device. The mechanical quality factor at 0° C. is preferably 800 or more, more preferably 900 or more, and much more preferably 1000 or more. Within this range, the drastic increase in power consumption in driving the device is prevented.

$|d_{31}|$ of the piezoelectric element at 0° C. is preferably 80 pm/V or more, more preferably 100 pm/V or more, and much more preferably 110 pm/V or more and 150 pm/V or less.

When the resistivity is $1 \times 10^9$ $\Omega \cdot$cm or more, more preferably $10 \times 10^9$ $\Psi \cdot$cm or more, and much more preferably $50 \times 10^9$ $\Omega \cdot$cm or more, the insulating property is sufficient in the practical application of the piezoelectric element. In Table 1, the resistivity [G $\Omega \cdot$cm] represents [$10^9$ $\Omega \cdot$cm].

Examples 2 to 44

The raw materials similar to those of Example 1 were weighed and through the similar procedure, piezoelectric ceramics with the compositions shown in Table 1 with a plurality of first crystal grains and a plurality of second crystal grains were fabricated.

In Examples 14 to 16 and Examples 20 and 26 in which the a-value is less than 1.000, the adjusted mixed powder was fabricated by adding the Ti material and the Zr material to the mixed powder containing 0.5 parts by weight of the calcined powder for forming the second crystal grains relative to 100 parts by weight of the calcined powder for forming the first crystal grains.

In regard to the piezoelectric ceramic according to Example 27, the Ba material and the Ti material were weighed to satisfy $Ba_6Ti_{17}O_{40}$, and the calcined powder for forming the second crystal grains was fabricated and used.

In regard to the piezoelectric ceramic according to Example 28, 0.25 parts by weight of the calcined powder fabricated to satisfy $Ba_4Ti_{12}O_{27}$ and 0.25 parts by weight of the calcined powder fabricated to satisfy $Ba_6Ti_{17}O_{40}$ were added to 100 parts by weight of the calcined powder for forming the first crystal grains.

In regard to the piezoelectric ceramics according to Examples 29 and 30, the particle diameter of the calcined body was controlled by changing the calcining temperature in fabricating the calcined powder for forming the second crystal grains.

In regard to the piezoelectric ceramics according to Examples 31 to 36, the amount of adding the calcined powder for forming the second crystal grains was changed.

In regard to the piezoelectric ceramics according to Examples 37 to 44, the temperature increasing time and the temperature to be maintained in the sintering were changed.

The piezoelectric ceramics according to Examples 2 to 44 were subjected to the analysis similar to that of Example 1. As a result, the preparation ratio of the raw materials coincides with the analysis value after the sintering in all the Examples. Table 1 shows the analysis values of the compositions, A1/B1, A2/B2, the proportion of the second crystal grains, the presence or absence of Mn in the second crystal grain, and the average equivalent circular diameter and the relative density of the first crystal grains.

With the fabricated piezoelectric ceramic, the piezoelectric element was fabricated through the procedure similar to that of Example 1. Table 1 shows the measurement results of the mechanical quality factor at 0° C., the piezoelectric constant ($d_{31}$) at 0° C., and the resistivity at room temperature (25° C.)

In Examples 1 and 4 to 11 where the x-value is 0.100 or more and 0.200 or less, $|d_{31}|$ at 0° C. is 100 [pm/V] or more, which is higher than that in Examples 2, 3, 12, and 13. In other words, the piezoelectric elements according to Examples 1 and 4 to 11 are more preferable. Moreover, in Examples 1 and 6 to 9 where the x-value is 0.120 or more and 0.180 or less, $|d_{31}|$ at 0° C. is 110 [pm/V] or more, which is higher than that in Examples 2 to 5 and 10 to 13. In other words, the piezoelectric elements according to Examples 1 and 6 to 9 are much more preferable.

In Examples 1 and 4 to 11 where the y-value is 0.040 or more and 0.083 or less, $|d_{31}|$ at 0° C. is 100 [pm/V] or more, which is higher than that in Examples 2, 3, 12, and 13. In other words, the piezoelectric elements according to Examples 1 and 4 to 11 are more preferable. Moreover, in Examples 1 and 6 to 9 where the y-value is 0.050 or more and 0.080 or less, $|d_{31}|$ at 0° C. is 110 [pm/V] or more, which is higher than that in Examples 2 to 5 and 10 to 13. In other words, the piezoelectric elements according to Examples 1 and 6 to 9 are much more preferable.

In Examples 15 to 18 where the a-value is 0.990 or more and 1.015 or less, the average equivalent circular diameter of the first crystal grains is 4.5 μm or less, which is smaller than that in Example 14 where the a-value is less than 0.990. In Examples 15 to 18 where the a-value is 0.990 or more and 1.015 or less, the relative density is 95% or more and $|d_{31}|$ at 0° C. is 100 [pm/V] or more, which are higher than those in Example 19 where the a-value is more than 1.015. In other words, the piezoelectric elements in Examples 15 to 18 are more preferable.

In Examples 24 and 25 where the content of Bi is 0.1 parts by weight or more and 0.4 parts by weight or less, the mechanical quality factor at 000 is 1000 or more, which is higher than that in Example 23 where the content of Bi is less than 0.1 parts by weight. In Examples 24 and 25, moreover, $|d_{31}|$ at 0° C. is 100 [pm/V] or more, which is higher than that in Example 26 where the content of Bi is more than 0.4 parts by weight. In other words, the piezoelectric elements in Examples 24 and 25 are more preferable.

In Example 30 where the relation of A1/B1>A2/B2 is satisfied, the resistivity at 25° C. is 50 [G Ω·cm] or more, which is higher than that in Example 29 where the value of A1/B1 is equal to that of A2/B2. In other words, the piezoelectric element in Example 30 is more preferable.

In Examples 32 to 35 where the proportion of the second crystal grains is 0.05 area % or more and 1 area % or less, the resistivity at 25° C. is 50 [G Ω·cm] or more, which is higher than that in Example 31 where the proportion of the second crystal grains is less than 0.05 area %, and the mechanical quality factor at 0° C. is 900 or more, which is higher than that in Example 36 where the proportion of the second crystal grains is more than 1 area %. In other words, the piezoelectric elements according to Examples 32 to 35 are more preferable.

In Examples 41 and 42 where the relative density is 95% or more, the mechanical quality factor at 0° C. is 900 or more, $|d_{31}|$ at 0° C. is 100 [pm/V] or more, and the resistivity at 25° C. is 50 [G Ω·cm] or more, which are higher than those in Example 40 where the relative density is less than 95%. In other words, the piezoelectric elements according to Examples 41 and 42 are more preferable. In Example 42 where the relative density is 97% or more, the mechanical quality factor at 0° C. is 1000 or more and $|d_{31}|$ at 0° C. is 110 [pm/V] or more, which are higher than those in comparison to Examples 40 and 41 where the relative density is less than 97%. In other words, the piezoelectric element according to Example 42 is more preferable.

In Examples 1 to 42 where the average equivalent circular diameter of the first crystal grains is 0.5 μm or more and 10 μm or less, the resistivity at 25° C. is 10 [G Ω·cm] or more, which is higher than that in Example 43 where the average equivalent circular diameter of the first crystal grains is less than 0.5 μm. In other words, the piezoelectric elements according to Examples 1 to 42 are more preferable.

In Examples 1 to 42, the average equivalent circular diameter of the first crystal grains is 0.5 μm or more and 10 μm or less, and in Example 44, the average equivalent circular diameter of the first crystal grains is more than 10 μm. With the three-point bending test using the tensile compression testing device, the mechanical strength of the piezoelectric elements according to Examples 1 to 42 and 44 was evaluated. The results indicate that the piezoelectric element according to Example 44 has a mechanical strength of 41 MPa, which is lower than 50 MPa or more of the piezoelectric elements according to Examples 1 to 42. In other words, the piezoelectric elements according to Examples 1 to 42 are more preferable.

Example 45

Fabrication of Multilayered Piezoelectric Element

As for the raw material, barium carbonate ($BaCO_3$) powder (purity 99.9% or more), calcium carbonate ($CaCO_3$) powder (purity 99.9% or more), bismuth oxide ($Bi_2O_3$) powder (purity 99.9% or more), titanium oxide ($TiO_2$) powder (purity 99.9% or more), zircon oxide ($ZrO_2$) powder (purity 99.9% or more), and trimanganese tetraoxide ($Mn_3O_4$) powder (purity 99.5% or more) were prepared.

The materials were weighed so that Ba, Ca, Ti and Zr satisfy the ratio of $(Ba_{0.860}Ca_{0.140})_{1.000}(Ti_{0.930}Zr_{0.070})O_3$ corresponding to the composition equivalent to Example 1, and heated at 1000° C. for five hours in an electric furnace. Thus, the calcined powder for forming the first crystal grain was fabricated. Next, the Ba material and the Ti material were weighed to satisfy $Ba_4Ti_{12}O_{27}$ and heated at 1000° C. for five hours. Thus, the calcined powder for forming the second crystal grain was fabricated. Then, 0.5 parts by weight of the calcined powder for forming the second crystal grain was added to 100 parts by weight of the calcined powder for forming the first crystal grain, thereby fabricating the mixed powder. The Ba material and the Ca material were added so that the ratio of the molar amount of Ba and Ca to the molar amount of Ti and Zr in the mixed powder was 1.002, thereby fabricating the adjusted mixed powder. In addition, the Bi material and the Mn material were added so that Bi constitutes 0.170 parts by weight and Mn constitutes 0.150 parts by weight on a metal basis relative to 100 parts by weight of the adjusted mixed powder. Then, the powder was stirred for 24 hours to fabricate the mixed calcined powder.

In this example, 0.1 parts by weight of glass agent including Si and B (containing 30 to 50 wt % of $SiO_2$ and 21.1 wt % of $B_2O_3$) was added to the calcined mixed powder.

After PVB was added to the obtained calcined mixed powder and the obtained powder was mixed, the powder was made into a sheet by doctor blade method, and thus a green sheet with a thickness of 50 nm was obtained.

A conductive paste for the internal electrode was printed on the green sheet. For the conductive paste, Ag 60%-Pd 40% alloy paste was used. Nine green sheets formed by applying the conductive paste were stacked, and the obtained multilayer body was sintered for five hours at 1200° C., thereby providing the sintered body. The sintered body was cut into a size of 10 mm×2.5 mm and the side surface thereof was polished. A pair of external electrodes (first electrode and second electrode) for short-circuiting the internal electrodes alternately was formed by Au sputtering, and the multilayered piezoelectric element as illustrated in FIG. 2B was fabricated.

Observation of the internal electrode of the obtained multilayered piezoelectric element indicates that the Ag-Pd as the electrode material and the piezoelectric material were alternately formed.

The polarization process was performed on the sample before the evaluation of the piezoelectricity. Specifically, the sample was heated at 100° C. in an oil bath, a voltage of 1 kV/mm was applied between the first electrode and the second electrode for 30 minutes, and the temperature was decreased to room temperature while the voltage was applied.

The results of evaluating the piezoelectricity of the obtained multilayered piezoelectric element indicate that the insulating property was sufficient and the piezoelectric characteristic was as high as that of the piezoelectric element including the piezoelectric ceramic according to Example 1.

Example 46

Multilayered Piezoelectric Element Including Internal Electrode in which Ag and Pd Weight Ratio is 0.25 or More and 4.00 or Less The multilayered piezoelectric element was fabricated using the conductive paste in which the ratio M1/M2 of the weight M1 of contained Ag to the weight M2 of contained Pd was 0.25. The obtained piezoelectric element has the sufficient insulating property and has the piezoelectric characteristic as high as that of the piezoelectric element including the piezoelectric ceramic according to Example 1.

Example 47

Multilayered Piezoelectric Element Including Ni or Cu as Internal Electrode

The mixed powder was fabricated through the procedure similar to that of Example 45. The obtained mixed powder was calcined in the atmosphere for three hours at 1000° C. while the powder was rotated in a rotary kiln, thereby providing the calcined powder. The obtained calcined powder was pulverized using a ball mill. PVB was added to the pulverized powder and mixed. After that, the powder was made into a green sheet with a thickness of 50 μm by a doctor blade method. On the green sheet, the conductive paste for the internal electrode was printed. Ni paste was used as the conductive paste. Nine of such green sheets with the conductive pates applied thereto were stacked and the multilayer body was thermally compressed.

The thermally compressed, multilayer body was sintered in a tubular furnace. The sintering was performed in the atmosphere up to 300° C., and after the binder was removed, the atmosphere was changed to the reductive atmosphere ($H_2:N_2=2:98$, oxygen concentration $2\times10^{-6}$ Pa) which was maintained for five hours at 1200° C. In the temperature-decreasing process, the temperature was decreased to the room temperature with the oxygen concentration changed to 30 Pa below 1000° C.

The sintered body obtained thus was cut into a size of 10 mm×2.5 mm, and the side surface thereof was polished. A pair of external electrodes (first electrode and second electrode) for short-circuiting the internal electrodes alternately was formed by Au sputtering, and the multilayered piezoelectric element as illustrated in FIG. 2B was fabricated.

Observation of the internal electrode of the obtained multilayered piezoelectric element indicates that Ni as the electrode material and the piezoelectric material were alternately formed. The obtained multilayered piezoelectric element was polarized in an oil bath maintained at 100° C. by applying an electric field of 1 kV/mm for 30 minutes. The results of evaluating the obtained multilayered piezoelectric element indicate that the insulating property is sufficient and the piezoelectric characteristic is as high as that of the piezoelectric element including the piezoelectric ceramic according to Example 1.

Example 48

Liquid Discharge Head by Piezoelectric Ceramic According to Example 1

By the use of the same piezoelectric ceramic as that of Example 1, the liquid discharge head illustrated in FIGS. 3A and 3B was fabricated. It has been confirmed that the ink was discharged following the input electric signals.

Example 49

Discharge Device with Liquid Discharge Head by Piezoelectric Ceramic According to Example 1

By the use of the liquid discharge head according to Example 48, the liquid discharge device 881 illustrated in FIG. 4 was fabricated. It has been confirmed that the ink discharged following the input electric signal was on the transfer target body.

Example 50

Ultrasonic Motor by Piezoelectric Ceramic According to Example 1

By the use of the same piezoelectric ceramic as that of Example 1, the ultrasonic motor illustrated in FIG. 6A was fabricated. It has been confirmed that the motor rotation behavior was in accordance with the application of the alternating voltage.

Example 51

By the use of the same piezoelectric ceramic as that of Example 1, the ultrasonic motor illustrated in FIG. 6B was fabricated. It has been confirmed that the motor rotation behavior was in accordance with the application of the alternating voltage.

Example 52

Optical Appliance Including Ultrasonic Motor by Piezoelectric Ceramic According to Example 1

By the use of the ultrasonic motor according to Example 50, the optical appliance illustrated in FIG. 7A was fabricated. It has been confirmed that the auto-focusing operation was in accordance with the application of the alternating voltage.

Example 53

Dust Removing Device by Piezoelectric Ceramic According to Example 1

By the use of the same piezoelectric ceramic as that of Example 1, the dust removing device 310 illustrated in FIGS. 9A and 9B was fabricated. The plastic beads were scattered on the surface of the vibration plate 320 and the alternating voltage was applied to the piezoelectric element 330. Then, it has been confirmed that the beads were successfully removed from the surface of the vibration plate 320.

Example 54

Imaging Device with Dust Removing Device by Piezoelectric Ceramic According to Example 1

The imaging device illustrated in FIG. 12 with the dust removing device 310 on the surface of the imaging sensor (not shown) was fabricated. The dust on the surface of the vibration plate 320 would deteriorate the captured image because the dust is reflected in the imaging sensor; however, by operating the dust removing device, the dust can be removed and the image with no defect can be provided.

Example 55

Electronic Appliance by Piezoelectric Ceramic According to Example 1

By the use of the multilayered piezoelectric element 2042 according to Example 45, the electronic appliance illustrated in FIG. 14 was fabricated. It has been confirmed that the speaker operation was in accordance with the application of the alternating voltage.

Comparative Examples 1 to 15

The materials were weighed to satisfy the compositions shown in Table 2 as a whole, and through the process similar to that of Example 1, the ceramic and elements according to Comparative Examples 1 to 15 were fabricated.

The ceramics according to Comparative Examples 1 to 15 were analyzed in a manner similar to that of Example 1. As a result, the preparation ratio of the materials coincides with the analysis value after the sintering in all the Comparative Examples. Table 2 shows the analysis values of the compositions, and the measurement results of A1/B1, A2/B2, the proportion of the second crystal grains, the presence or absence of Mn in the second crystal grain, the average equivalent circular diameter of the first crystal grains, the relative density, the mechanical quality factor at 0° C., the absolute value $|d_{31}|$ of the piezoelectric constant $d_{31}$ at 0° C., the resistivity at room temperature (25° C.).

Since the element according to Comparative Example 10 had low resistance value, the polarization process was failed.

The elements according to Comparative Examples 1, 4, and 6 where the x-value is less than 0.090 were not suitable for the use in the piezoelectric devices because the piezoelectric characteristic was changed largely relative to the ambient temperature in comparison to Examples 1 to 44. In addition, in the elements according to Comparative Examples 3, 5, and 8 where the x-value is more than 0.30, $|d_{31}|$ at 0° C. is less than 80 [pm/V], which is lower than that in Examples 1 to 44.

In the elements according to Comparative Examples 6, 7, and 8 where the y-value is less than 0.025, the piezoelectric constant $d_{3L}$ at 0° C. is less than 80 [pm/V] and the mechanical quality factor at 0° C. is less than 800, which are lower than those in Examples 1 to 44. In addition, in the elements according to Comparative Examples 1, 2, and 3 where the y-value is more than 0.085, $|d_{31}|$ at 0° C. is less than 80 [pm/V], which is lower than that of the piezoelectric elements according to Examples 1 to 44.

In the ceramic according to Comparative Example 9 where the a-value is less than 0.986, the average equivalent circular diameter of the first crystal grains is 17.1 μm, which is remarkably larger than that in Examples 1 to 44. With the three-point bending test using the tensile compression testing device, the mechanical strength of the element according to Comparative Example 9 and the piezoelectric elements according to Examples 1 to 44 was evaluated. The results indicate that the element of Comparative Example 9 has the mechanical strength of 19 MPa, which is drastically lower than 40 MPa or more of the piezoelectric elements according to Examples 1 to 44. In the ceramic and element according to Comparative Example 10 where the a-value is more than 1.020, the relative density is 90.3% and the resistivity was 0.7 [G Ω·cm] at 25° C., which are drastically lower than those of the piezoelectric ceramics according to Examples 1 to 44.

In the element according to Comparative Example 11 whose content of Mn is less than 0.04 parts by weight, $|d_{31}|$ at 0° C. is 63 [pm/V] and the mechanical quality factor at 0° C. is 598, which are lower than those in Examples 1 to 44. In the element according to Comparative Example 12 whose content of Mn is more than 0.36 parts by weight, the consumption power when the element is driven as the resonance device is large as compared to the piezoelectric elements according to Examples 1 to 44, so that the element according to Comparative Example 12 is not suitable for the use in the resonance device.

In the element according to Comparative Example 13 whose content of Bi is less than 0.042 parts by weight, the mechanical quality factor at 0° is 639, which is lower than that of the piezoelectric element according to Examples 1 to 44. In addition, in the element according to Comparative Example 14 whose content of Bi is more than 0.850 parts by weight, $|d_{31}|$ at 0° C. is 52 [pm/V], which is lower than that in Examples 1 to 44.

In the ceramic according to Comparative Example 15 in which the second crystal grains are not included, it has been known that the amount of Mn (manganese) included in the first crystal grains is less than the weighed amount of Mn because manganese oxide is segregated to the grain boundary. Due to the influence of low Mn concentration in the first crystal grains, the element according to Comparative Example 15 has lower mechanical quality factor and lower resistivity than those of Examples in Table 1. That is to say, it has been confirmed that by having the structure of the piezoelectric ceramic including the second crystal grains, the segregation of the Mn component to the outside of the first crystal grain can be suppressed more effectively and the mechanical quality factor and the resistivity are therefore increased.

Through the procedure similar to that of Example 1, the piezoelectric ceramic containing 0.15 parts by weight of Mn and 0 parts by weight of Bi and having x=0, y=0, and a=1.000 was fabricated. It has been confirmed that the piezoelectric ceramic has the second crystal grains mainly containing $Ba_4Ti_{12}O_{27}$, but the mechanical quality factor at 0° C. is lower than that of Example 1.

TABLE 1

| | x | y | a | Mn (parts by weight) | Bi (parts by weight) | A1/B1 | A2/B2 | Main component of second crystal grain | Proportion of second crystal grains (area %) | Presence/absence of Mn in second crystal grain | Average equivalent circular diameter of first crystal grains [μm] | Relative density [%] | Mechanical quality factor at 0° C. | Piezoelectric constant at 0° C. \|d31\| [pm/V] | Resistivity at 25° C. [GΩ·cm] |
|---|---|---|---|---|---|---|---|---|---|---|---|---|---|---|---|
| Example 1 | 0.140 | 0070 | 1.002 | 0.150 | 0.170 | 1.005 | 1.001 | Ba4Ti12O27 | 0.07 | ○ | 3.2 | 99.5 | 1256 | 129 | 76 |
| Example 2 | 0.090 | 0085 | 1.002 | 0.150 | 0.170 | 1.005 | 1.001 | Ba4Ti12O27 | 0.07 | ○ | 2.8 | 96.8 | 932 | 95 | 61 |
| Example 3 | 0.300 | 0.085 | 1.002 | 0.150 | 0.170 | 1.004 | 1.001 | Ba4Ti12O27 | 0.06 | ○ | 2.7 | 95.3 | 984 | 97 | 63 |
| Example 4 | 0.100 | 0.033 | 1.002 | 0.150 | 0.170 | 1.005 | 1.001 | Ba4Ti12O27 | 0.07 | ○ | 3.0 | 98.8 | 1027 | 102 | 71 |
| Example 5 | 0.200 | 0.083 | 1.002 | 0.150 | 0.170 | 1.005 | 1.001 | Ba4Ti12O27 | 0.07 | ○ | 3.0 | 97.9 | 1006 | 108 | 71 |
| Example 6 | 0.120 | 0.080 | 1.002 | 0.150 | 0.170 | 1.005 | 1.001 | Ba4Ti12O27 | 0.07 | ○ | 3.1 | 99.1 | 1222 | 131 | 74 |
| Example 7 | 0.180 | 0.080 | 1.002 | 0.150 | 0.170 | 1.005 | 1.001 | Ba4Ti12O27 | 0.07 | ○ | 3.0 | 99.0 | 1260 | 122 | 76 |
| Example 8 | 0.120 | 0.050 | 1.002 | 0.150 | 0.170 | 1.005 | 1.001 | Ba4Ti12O27 | 0.07 | ○ | 3.3 | 98.7 | 1247 | 115 | 76 |
| Example 9 | 0.180 | 0.050 | 1.002 | 0.150 | 0.170 | 1.005 | 1.001 | Ba4Ti12O27 | 0.07 | ○ | 3.3 | 98.7 | 1255 | 111 | 75 |
| Example 10 | 0.100 | 0.040 | 1.002 | 0.150 | 0.170 | 1.005 | 1.001 | Ba4Ti12O27 | 0.07 | ○ | 3.5 | 98.0 | 1248 | 108 | 75 |
| Example 11 | 0.200 | 0.040 | 1.002 | 0.150 | 0.170 | 1.005 | 1.001 | Ba4Ti12O27 | 0.07 | ○ | 3.4 | 98.2 | 1279 | 103 | 79 |
| Example 12 | 0.090 | 0.025 | 1.002 | 0.150 | 0.170 | 1.005 | 1.001 | Ba4Ti12O27 | 0.07 | ○ | 3.6 | 96.6 | 1250 | 94 | 75 |
| Example 13 | 0.300 | 0.025 | 1.002 | 0.150 | 0.170 | 1.004 | 1.000 | Ba4Ti12O27 | 0.06 | ○ | 3.5 | 96.5 | 1261 | 87 | 76 |
| Example 14 | 0.140 | 0.070 | 0.986 | 0.150 | 0.170 | 0.991 | 0.982 | Ba4Ti12O27 | 0.12 | ○ | 9.6 | 96.6 | 929 | 89 | 66 |
| Example 15 | 0.140 | 0.070 | 0.990 | 0.150 | 0.170 | 0.995 | 0.987 | Ba4Ti12O27 | 0.10 | ○ | 4.4 | 97.0 | 1015 | 104 | 69 |
| Example 16 | 0.140 | 0.070 | 0.996 | 0.150 | 0.170 | 0.993 | 0.990 | Ba4Ti12O27 | 0.09 | ○ | 4.2 | 98.4 | 1060 | 110 | 70 |
| Example 17 | 0.140 | 0.070 | 1.010 | 0.150 | 0.170 | 1.013 | 1.008 | Ba4Ti12O27 | 0.07 | ○ | 2.0 | 99.0 | 1104 | 123 | 73 |
| Example 18 | 0.140 | 0.070 | 1.015 | 0.150 | 0.170 | 1.017 | 1.010 | Ba4Ti12O27 | 0.06 | ○ | 1.6 | 96.8 | 979 | 105 | 62 |
| Example 19 | 0.140 | 0.070 | 1.020 | 0.150 | 0.170 | 1.022 | 1.018 | Ba4Ti12O27 | 0.05 | ○ | 0.6 | 94.6 | 836 | 91 | 59 |
| Example 20 | 0.140 | 0.070 | 0.990 | 0.150 | 0.170 | 0.996 | 0.988 | Ba4Ti12O27 | 0.08 | ○ | 3.2 | 96.2 | 822 | 84 | 57 |
| Example 21 | 0.140 | 0.070 | 1.002 | 0.040 | 0.170 | 1.005 | 1.001 | Ba4Ti12O27 | 0.07 | ○ | 3.8 | 99.3 | 1043 | 128 | 67 |
| Example 22 | 0.140 | 0.070 | 1.002 | 0.240 | 0.170 | 1.015 | 1.007 | Ba4Ti12O27 | 0.07 | ○ | 3.8 | 99.1 | 1011 | 136 | 64 |
| Example 23 | 0.140 | 0.070 | 1.010 | 0.360 | 0.170 | 1.005 | 1.005 | Ba4Ti12O27 | 0.07 | ○ | 3.0 | 98.3 | 819 | 129 | 54 |
| Example 24 | 0.140 | 0.070 | 1.004 | 0.150 | 0.042 | 1.005 | 1.001 | Ba4Ti12O27 | 0.07 | ○ | 3.2 | 98.5 | 1122 | 127 | 70 |
| Example 25 | 0.140 | 0.070 | 1.000 | 0.150 | 0.100 | 1.005 | 1.001 | Ba4Ti12O27 | 0.07 | ○ | 4.1 | 99.0 | 1096 | 107 | 71 |
| Example 26 | 0.140 | 0.070 | 0.996 | 0.150 | 0.400 | 1.005 | 1.001 | Ba4Ti12O27 | 0.07 | ○ | 4.3 | 97.1 | 984 | 88 | 63 |
| Example 27 | 0.140 | 0.070 | 1.002 | 0.150 | 0.850 | 1.005 | 1.001 | Ba6Ti17O40 | 0.07 | ○ | 2.9 | 99.2 | 1251 | 123 | 77 |
| Example 28 | 0.140 | 0.070 | 1.002 | 0.150 | 0.170 | 1.005 | 1.000 | Ba4Ti12O27 Ba6Ti17O40 | 0.08 | ○ | 3.0 | 99.4 | 1249 | 126 | 76 |
| Example 29 | 0.140 | 0.070 | 1.002 | 0.150 | 0.170 | 1.002 | 1.002 | Ba4Ti12O27 | 0.05 | ○ | 4.3 | 94.4 | 947 | 83 | 19 |
| Example 30 | 0.140 | 0.070 | 1.002 | 0.150 | 0.170 | 1.010 | 0.999 | Ba4Ti12O27 | 0.07 | ○ | 3.3 | 99.5 | 1187 | 127 | 89 |
| Example 31 | 0.140 | 0.070 | 1.002 | 0.150 | 0.170 | 1.003 | 0.001 | Ba4Ti12O27 | 0.02 | ○ | 3.6 | 96.0 | 920 | 87 | 17 |
| Example 32 | 0.140 | 0.070 | 1.002 | 0.150 | 0.170 | 1.005 | 1.001 | Ba4Ti12O27 | 0.05 | ○ | 3.3 | 96.6 | 1190 | 110 | 52 |
| Example 33 | 0.140 | 0.070 | 1.002 | 0.150 | 0.170 | 1.005 | 1.000 | Ba4Ti12O27 | 0.22 | ○ | 3.1 | 97.4 | 1149 | 111 | 68 |
| Example 34 | 0.140 | 0.070 | 1.002 | 0.150 | 0.170 | 1.006 | 1.000 | Ba4Ti12O27 | 0.48 | ○ | 3.1 | 97.2 | 1036 | 106 | 67 |
| Example 35 | 0.140 | 0.070 | 1.002 | 0.150 | 0.170 | 1.008 | 0.999 | Ba4Ti12O27 | 0.99 | ○ | 2.9 | 96.9 | 998 | 92 | 59 |
| Example 36 | 0.140 | 0.070 | 1.002 | 0.150 | 0.170 | 1.008 | 0.998 | Ba4Ti12O27 | 1.10 | ○ | 2.7 | 96.3 | 854 | 81 | 38 |
| Example 37 | 0.140 | 0.070 | 1.002 | 0.150 | 0.170 | 1.006 | 0.999 | Ba4Ti12O27 | 0.09 | ○ | 0.5 | 94.1 | 961 | 102 | 40 |
| Example 38 | 0.140 | 0.070 | 1.002 | 0.150 | 0.170 | 1.004 | 1.001 | Ba4Ti12O27 | 0.07 | ○ | 4.5 | 98.8 | 1223 | 126 | 73 |
| Example 39 | 0.140 | 0.070 | 1.004 | 0.150 | 0.170 | 1.004 | 1.001 | Ba4Ti12O27 | 0.06 | ○ | 9.7 | 95.5 | 1159 | 119 | 72 |
| Example 40 | 0.140 | 0.070 | 1.002 | 0.150 | 0.170 | 1.006 | 0.990 | Ba4Ti12O27 | 0.08 | ○ | 1.1 | 93.0 | 848 | 83 | 12 |
| Example 41 | 0.140 | 0.070 | 1.002 | 0.150 | 0.170 | 1.006 | 1.000 | Ba4Ti12O27 | 0.08 | ○ | 1.3 | 95.2 | 965 | 100 | 56 |
| Example 42 | 0.140 | 0.070 | 1.002 | 0.150 | 0.170 | 1.005 | 1.000 | Ba4Ti12O27 | 0.07 | ○ | 2.0 | 97.5 | 1033 | 113 | 71 |
| Example 43 | 0.300 | 0.085 | 1.002 | 0.150 | 0.170 | 1.005 | 1.000 | Ba4Ti12O27 | 0.08 | ○ | 0.4 | 92.7 | 812 | 83 | 7 |
| Example 44 | 0.300 | 0.085 | 1.002 | 0.150 | 0.170 | 1.003 | 1.001 | Ba4Ti12O27 | 0.05 | ○ | 10.7 | 95.1 | 839 | 101 | 45 |

TABLE 2

| | x | y | a | Mn (parts by weight) | Bi (parts by weight) | A1/B1 | A2/B2 | Main component of second crystal grain | Proportion of second crystal grains (area %) | Presence/absence of Mn in second crystal grain | Average equivalent circular diameter of first crystal grains [μm] | Relative density [%] | Mechanical quality factor at 0° C. | Piezoelectric constant at 0° C. |d31| [pm/V] | Resistivity at 25° C. [GΩ·cm] |
|---|---|---|---|---|---|---|---|---|---|---|---|---|---|---|---|
| Comparative Example 1 | 0.060 | 0.100 | 1.002 | 0.150 | 0.170 | 1.005 | 1.001 | Ba4Ti12O27 | 0.07 | ○ | 2.6 | 94.2 | 650 | 70 | 23 |
| Comparative Example 2 | 0.200 | 0.100 | 1.002 | 0.150 | 0.170 | 1.005 | 1.001 | Ba4Ti12O27 | 0.07 | ○ | 2.5 | 93.5 | 655 | 72 | 18 |
| Comparative Example 3 | 0.350 | 0.100 | 1.002 | 0.150 | 0.170 | 1.004 | 1.001 | Ba4Ti12O27 | 0.06 | ○ | 2.5 | 92.8 | 642 | 59 | 8 |
| Comparative Example 4 | 0.060 | 0.060 | 1.002 | 0.150 | 0.170 | 1.005 | 1.001 | Ba4Ti12O27 | 0.07 | ○ | 3.2 | 97.0 | 922 | 62 | 62 |
| Comparative Example 5 | 0.350 | 0.060 | 1.002 | 0.150 | 0.170 | 1.004 | 1.000 | Ba4Ti12O27 | 0.07 | ○ | 3.0 | 96.6 | 957 | 53 | 61 |
| Comparative Example 6 | 0.060 | 0.010 | 1.002 | 0.150 | 0.170 | 1.005 | 1.001 | Ba4Ti12O27 | 0.07 | ○ | 3.9 | 99.1 | 1051 | 51 | 69 |
| Comparative Example 7 | 0.200 | 0.010 | 1.002 | 0.150 | 0.170 | 1.005 | 1.001 | Ba4Ti12O27 | 0.06 | ○ | 3.4 | 98.9 | 1108 | 50 | 66 |
| Comparative Example 8 | 0.350 | 0.010 | 1.002 | 0.150 | 0.170 | 1.004 | 1.001 | Ba4Ti12O27 | 0.06 | ○ | 3.3 | 98.9 | 1074 | 49 | 66 |
| Comparative Example 9 | 0.140 | 0.070 | 0.982 | 0.150 | 0.170 | 0.989 | 0.977 | Ba4Ti12O27 | 0.13 | ○ | 17.1 | 93.5 | 836 | 68 | 37 |
| Comparative Example 10 | 0.140 | 0.070 | 1.024 | 0.150 | 0.170 | 1.025 | 1.023 | Ba4Ti12O27 | 0.03 | X | 0.2 | 90.3 | X | X | 0.7 |
| Comparative Example 11 | 0.140 | 0.070 | 1.002 | 0.030 | 0.170 | 1.005 | 1.001 | Ba4Ti12O27 | 0.07 | ○ | 3.1 | 96.2 | 598 | 63 | 51 |
| Comparative Example 12 | 0.140 | 0.070 | 1.002 | 0.400 | 0.170 | 1.005 | 1.000 | Ba4Ti12O27 | 0.08 | ○ | 4.0 | 98.7 | 855 | 74 | 6 |
| Comparative Example 13 | 0.140 | 0.070 | 1.002 | 0.150 | 0.030 | 1.005 | 1.001 | Ba4Ti12O27 | 0.07 | ○ | 2.8 | 99.0 | 039 | 107 | 24 |
| Comparative Example 14 | 0.140 | 0.070 | 1.002 | 0.150 | 0.900 | 1.004 | 1.001 | Ba4Ti12O27 | 0.06 | ○ | 4.5 | 97.6 | 877 | 52 | 48 |
| Comparative Example 15 | 0.140 | 0.070 | 1.002 | 0.150 | 0.170 | 1.002 | 1.002 | — | 0.00 | — | 11.0 | 93.0 | 621 | 71 | 3 |

The piezoelectric ceramic according to the present invention has both the excellent piezoelectric constant and the excellent mechanical quality factor, and is harmless to the environment because this ceramic is free from lead and alkali metal. Therefore, the piezoelectric ceramic according to the present invention can be used for the piezoelectric devices including the liquid discharge head, the ultrasonic motor, and the dust removing device. Moreover, the piezoelectric ceramic according to the present invention can be used for the optical appliance, the imaging device, and the electronic appliance including the piezoelectric device.

According to the present invention, the piezoelectric ceramic having both the excellent piezoelectric constant and the excellent mechanical quality factor particularly at low temperature can be provided by controlling the composition of the crystal grain boundary and the crystal structure.

Further, the present invention can provide the piezoelectric element, the multilayered piezoelectric element, the liquid discharge head, the liquid discharge device, the ultrasonic motor, the optical appliance, the vibration device, the dust removing device, the imaging device, and the electronic appliance including the piezoelectric ceramic.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-003579, filed Jan. 9, 2015, which is hereby incorporated by reference herein in its entirety.

What is claimed is:

1. A piezoelectric material comprising: a metal oxide represented by General Formula (1); and 0.04 parts by weight or more and 0.36 parts by weight or less of Mn and 0.042 parts by weight or more and 0.850 parts by weight or less of Bi on a metal basis relative to 100 parts by weight of the metal oxide, wherein the piezoelectric material includes first crystal grains having a perovskite structure, and second crystal grains having a crystal structure different from that of the first crystal grain, and the second crystal grain contains at least one metal oxide selected from $Ba_4Ti_{12}O_{27}$ and $Ba_6Ti_{17}O_{40}$

$(Ba_{1-x}Ca_x)_a(Ti_{1-y}Zr_y)O_3$ (1)

(where $0.09 \leq x \leq 0.30$, $0.025 \leq y \leq 0.085$, $0.986 \leq a \leq 1.02$).

2. The piezoelectric material according to claim 1, wherein a ratio A1/B1 of a molar number A1 of Ba and Ca to a molar number B1 of Ti and Zr in the first crystal grain in contact with the second crystal grain, and a ratio A2/B2 of a molar number A2 of Ba and Ca to a molar number B2 of Ti and Zr in the first crystal grain not in contact with the second crystal grain satisfy a relation of A1/B1>A2/B2.

3. The piezoelectric material according to claim 1, wherein a proportion of the second crystal grains in observation of a surface or cross section of the piezoelectric material is 0.05 area % or more and 1 area % or less of an entire area of the surface or cross section of the piezoelectric material.

4. The piezoelectric material according to claim 1, wherein the main component of the second crystal grain contains Mn.

5. The piezoelectric material according to claim 1, wherein an average equivalent circular diameter of the first crystal grain included in the piezoelectric material is 500 nm or more and 10 μm or less.

6. The piezoelectric material according to claim 1, wherein the piezoelectric material has a relative density of 93% or more and 100% or less.

7. A piezoelectric element comprising at least a first electrode, a piezoelectric material portion, and a second electrode, wherein the piezoelectric material constituting the piezoelectric material portion is the piezoelectric material according to claim 1.

8. A multilayered piezoelectric element formed by alternately stacking a plurality of piezoelectric material layers and a plurality of electrode layers, wherein the piezoelectric material layers are composed of the piezoelectric material according to claim 1.

9. The multilayered piezoelectric element according to claim 8, wherein the internal electrode contains Ag and Pd, and a weight ratio M1/M2 of a weight M1 of the contained Ag to a weight M2 of the contained Pd satisfies $0.25 \leq M1/M2 \leq 4.0$.

10. The multilayered piezoelectric element according to claim 8, wherein the internal electrode contains at least one of Ni and Cu.

11. A liquid discharge head comprising a liquid chamber including a vibration portion provided with the piezoelectric element according to claim 7, and a discharge port communicating with the liquid chamber.

12. A liquid discharge device comprising a placement portion for a transfer target body and the liquid discharge head according to claim 11.

13. An ultrasonic motor comprising a vibration body provided with the piezoelectric element according to claim 7 and a mobile body in contact with the vibration body.

14. An optical appliance comprising the ultrasonic motor according to claim 13 in a driving portion.

15. A vibration device comprising a vibration body provided with the piezoelectric element according to claim 7 on a vibration plate.

16. A dust removing device comprising the vibration device according to claim 15 in a vibration portion.

17. An imaging device comprising at least the dust removing device according to claim 16, and an imaging element unit, wherein the vibration plate of the dust removing device is provided on a light receiving surface side of the imaging element unit.

18. An electronic appliance comprising a piezoelectric acoustic component including the piezoelectric element according to claim 7.

19. A piezoelectric device comprising: the piezoelectric element according to claim 7; and
    at least one of a voltage application unit configured to apply voltage to the piezoelectric element and a power extraction unit configured to extract power from the piezoelectric element.

20. A liquid discharge head comprising at least a liquid chamber including a vibration portion provided with the multilayered piezoelectric element according to claim 8, and a discharge port communicating with the liquid chamber.

21. A liquid discharge device comprising a placement portion for a transfer target body and the liquid discharge head according to claim 20.

22. An ultrasonic motor comprising at least a vibration body provided with the multilayered piezoelectric element according to claim 8 and a mobile body in contact with the vibration body.

23. An optical appliance comprising the ultrasonic motor according to claim 22 in a driving portion.

24. A vibration device comprising a vibration body provided with the multilayered piezoelectric element according to claim 8 on a vibration plate.

25. A dust removing device comprising the vibration device according to claim 24 in a vibration portion.

26. An imaging device comprising at least the dust removing device according to claim 25, and an imaging element unit, wherein the vibration plate of the dust removing device is provided on a light receiving surface side of the imaging element unit.

27. An electronic appliance comprising a piezoelectric acoustic component including the multilayered piezoelectric element according to claim 8.

28. A piezoelectric device comprising: the multilayered piezoelectric element according to claim 8; and
at least one of a voltage application unit configured to apply voltage to the multilayered piezoelectric element and a power extraction unit configured to extract power from the multilayered piezoelectric element.

29. A piezoelectric material comprising:
an oxide containing Ba, Ca, Ti and Zr;
Mn;
Bi; and
at least one selected from $Ba_4Ti_{12}O_{27}$ and $Ba_6Ti_{17}O_{40}$
wherein, when a molar ratio of Ca is x relative to a total content of Ba and Ca, x satisfies $0.09 \leq x \leq 0.30$,
wherein, when a molar ratio of Zr is y relative to a total content of Ti and Zr, y satisfies $0.025 \leq y \leq 0.085$,
wherein Mn content is 0.04 parts by weight or more and 0.36 parts by weight or less relative to 100 parts by weight of the metal oxide on a metal basis, and
wherein Bi content is 0.042 parts by weight or more and 0.850 parts by weight or less relative to 100 parts by weight of the metal oxide on a metal basis.

30. The piezoelectric material according to claim 29, wherein when a mole ratio of a total content of Ba and Ca is $\alpha$ relative to a total content of Ti and Zr, $\alpha$ satisfies $0.9900 \leq \alpha \leq 1.0100$.

31. A piezoelectric element comprising:
a first electrode,
the piezoelectric material according to claim 29, and
a second electrode.

32. An electronic appliance comprising the piezoelectric element according to claim 31.

* * * * *